(12) United States Patent
Miyauchi et al.

(10) Patent No.: US 7,051,270 B2
(45) Date of Patent: May 23, 2006

(54) DECODER AN DECODING METHOD

(75) Inventors: Toshiyuki Miyauchi, Tokyo (JP);
Masayuki Hattori, Kanagawa (JP);
Kouhei Yamamoto, Tokyo (JP);
Takashi Yokokawa, Tokyo (JP)

(73) Assignee: Sony Corporation, Tokyo (JP)

( * ) Notice: Subject to any disclaimer, the term of this patent is extended or adjusted under 35 U.S.C. 154(b) by 423 days.

(21) Appl. No.: 10/110,670

(22) PCT Filed: Aug. 20, 2001

(86) PCT No.: PCT/JP01/07125

§ 371 (c)(1),
(2), (4) Date: Aug. 13, 2002

(87) PCT Pub. No.: WO02/17499

PCT Pub. Date: Feb. 28, 2002

(65) Prior Publication Data

US 2003/0088823 A1 May 8, 2003

(51) Int. Cl.
*H03M 13/03* (2006.01)
*H03M 13/00* (2006.01)

(52) U.S. Cl. .................... 714/794; 714/795; 714/780

(58) Field of Classification Search ............... 714/794, 714/795, 796, 780
See application file for complete search history.

(56) References Cited

OTHER PUBLICATIONS

Papke, L.; Robertson, P.; Villebrun, E.; Improved decoding with the SOVA in a parallel concatenated (Turbo-code) scheme; IEEE International Conference on Communications, vol.: 1; Jun. 23-27, 1996; pp. 102-106.*

Weon Yong Joo; Soon Young Yoon; Hwang Soo Lee; A weighted parallel interference cancellation detector for convolutionally coded CDMA systems; IEEE 51st Vehicular Technology Conference Proceedings; vol.: 2; May 15-18, 2000; pp.: 1100-1104.*

Yano, et al., "Sub-log-MAP wo Tekiyou shita Tubro Fugou no Nan-hantei Bit no Kentou," Densi Joho Tsuushin Gakai Gijutsu Kenkyuu Houkoku, Denshi Joho Tsuushi Gakkai, vol. 99, No. 142, Jun. 25, 1999, pp. 7-12.

* cited by examiner

*Primary Examiner*—Joseph Torres
(74) *Attorney, Agent, or Firm*—Finnegan, Henderson, Farabow, Garrett & Dunner, L.L.P.

(57) ABSTRACT

A decoder that receives, as input, probability information $AMP/C_R \times y_t$. This probability information is obtained by dividing a channel value obtained by multiplication of received value $y_t$ and a predetermined coefficient AMP by the first additive coefficient $C_R$ for regulating the amplitude of the received value $y_t$ and the probability information $1/C_A \times APP_t$ obtained by multiplying the a priori probability information $APP_t$ by the reciprocal of the second additive coefficient $C_A$ for regulating the amplitude of the a priori probability information $APP_t$ to a soft-output decoding circuit. The soft-output decoding circuit, which may be a large scale intergrated circuit, generates log soft-output $C_I \times I\lambda_t$ and/or external information $1/C_A \times EX_t$ using additive coefficients for regulating the amplitude of arithmetic operations in the inside of the soft-output decoding circuit.

58 Claims, 21 Drawing Sheets

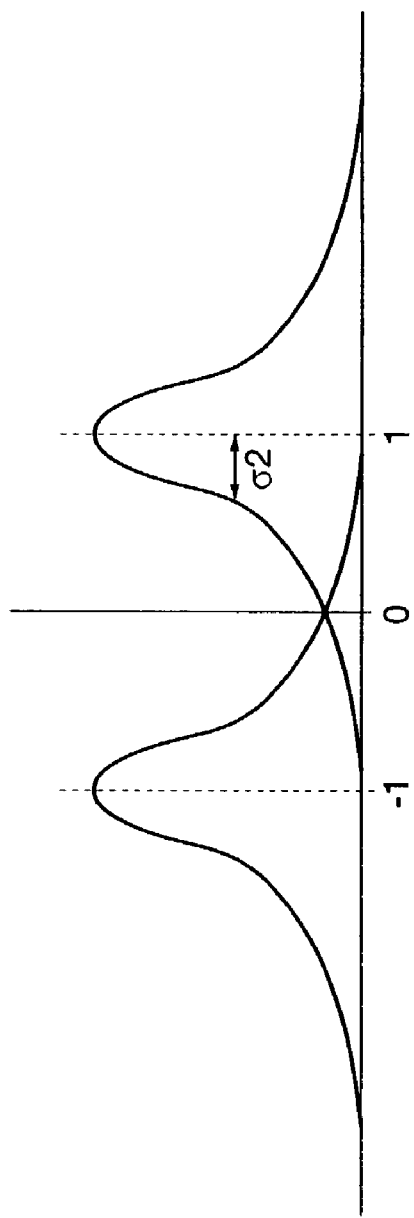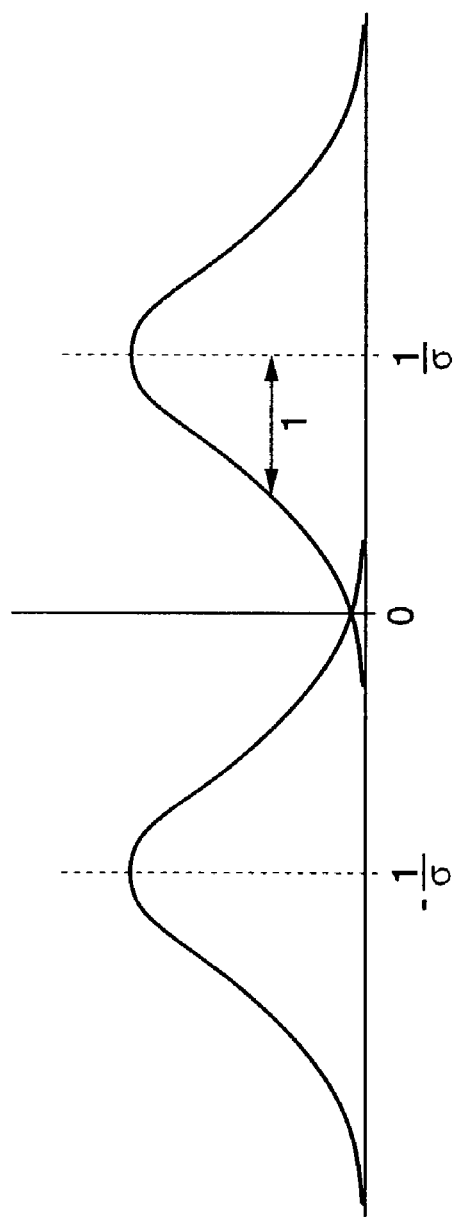
FIG.25A
FIG.25B

DECODER AN DECODING METHOD

TECHNICAL FIELD

This invention relates to a decoder and a decoding method for decoding a soft-output.

BACKGROUND ART

Research efforts have been made in recent years for reducing symbol error rates by using soft-outputs for decoded outputs of inner codes of concatenated codes and also for outputs of iterative decoding operations using an iterative decoding method. Studies of decoding methods for minimizing symbol error rates are being made extensively. For example, Bahl, Cock, Jelinek and Raviv, "Optimal decoding of linear codes for minimizing symbol error rate" IEEE Trans. Inf. Theory, vol. IT-20, pp. 284–287, March 1974, describes BCJR algorithm as a method for minimizing the symbol error rate when decoding a predetermined code such as a convolutional code. The BCJR algorithm is adapted to output the likelihood of each symbol instead of outputting each symbol as a result of a decoding operation. Such an output is referred to as soft-output. Now, the BCJR algorithm will be summarily described below. In the following description, it is assumed that a piece of digital information is turned into a convolutional code by means of encoder 201 of a transmitter (not shown) and the output of the encoder is input to a receiver (not shown) by way of a memoryless communication channel 202 having noise and decoded by decoder 203 of the receiver for observation.

Firstly, M states (transition state) representing the contents of the shift register of the encoder 201 are expressed by m (0, 1, . . . , M−1) and the state at clock time t is expressed by $S_t$. Also, if a k-bit information is input in a single time slot the input at clock time t is expressed by $i_t=(i_{t1}, i_{t2}, \ldots, i_{tk})$ and the input system is expressed by $I_1^T=(i_1, i_2, \ldots, i_T)$. If there is a transition from state m' to state m, the information bit corresponding to the transition is expressed by $i(m', m)=(i_1(m', m), i_2(m', m), \ldots, i_k(m', m))$. Additionally, if an n-bit code is output in a single time slot, the output at clock time t is expressed by $X_t=(x_{t1}, x_{t2}, \ldots, x_{tn})$ and the output system is expressed by $X_1^T=(x_1, x_2, \ldots, x_T)$. If there is a transition from state m' to state m, the code bit corresponding to the transition is expressed by $X(m', m)=(x_1(m', m), x_2(m', m), \ldots, x_n(m', m))$.

The convolutional coding of the encoder 201 starts at state $S_0=0$ and ends at state $S_T=0$ after outputting $X_1^T$. The inter-state transition probability $P_t(m|m')$ of each state is defined by formula (1) below;

$$P_t(m|m')=P_r\{S_t=m|S_{t-1}=m'\} \quad (1),$$

where $Pr\{A|B\}$ at the right side represents the conditional probability of occurrence of A under the condition of occurrence of B. This transition probability $P_t(m|m')$ is equal to the probability $Pr\{i_t=i\}$ that $i_t$ is i at clock time t when a transition from state m' to state m occurs in response to input i.

$$P_t(m|m')=P_r\{i_1=i\} \quad (2)$$

The memoryless communication channel 202 having noise receives $X_1^T$ as input and output $Y_1^T$. If an n-bit value to be received is output in a single time slot, the output at clock time t is expressed by $y_t=(y_{t1}, y_{t2}, \ldots, y_{tn})$ and the expression of $Y_1^T=(y_1, y_2, \ldots, y_T)$ is used. Then, the transition probability of the memoryless communication channel 202 having noise is defined by formula (3) below, using the transition probability $Pr\{y_j|x_j\}$ of all the symbols for all $t(1 \leq t \leq T)$.

$$Pr\{Y_1^t \mid X_1^t\} = \prod_{j=1}^{t} Pr\{y_j \mid x_j\} \quad (3)$$

Now, $\lambda_{tj}$ is defined by formula (4) below. It will be appreciated that $\lambda_{tj}$ of formula (4) below represents the likelihood of the input information at clock time t when $Y_1^T$ is received and hence the soft-output to be obtained.

$$\lambda_{ij} = \frac{Pr\{i_{ij} = 1 \mid Y_1^T\}}{Pr\{i_{ij} = 0 \mid Y_1^T\}} \quad (4)$$

With the BCJR algorithm, probabilities $\alpha_1$, $\beta_1$ and $\gamma_1$ are defined respectively by formulas (5) through (7) below. Note that $Pr\{A; B\}$ represents the probability of occurrence of both A and B.

$$\alpha_t(m)=Pr\{S_t=m; Y_1^t\} \quad (5)$$

$$\beta_t(m)=Pr\{Y_{t+1}^T|S_t=m\} \quad (6)$$

$$\gamma_t(m',m)=Pr\{S_t=m; y_t|S_{t-1}=m'\} \quad (7)$$

Now, the probabilities $\alpha_t$, $\beta_t$ and $\gamma_t$ will be specifically described below by referring to FIG. 2 of the accompanying drawings that illustrates a trellis diagram, or a state transition diagram that can be used in the encoder 201. In FIG. 2, $\alpha_{t-1}$ corresponds to the passing probability of each state at clock time t−1 that is computed sequentially on a time series basis from state $S_0=0$ at the coding start time by using the received value and $\beta_t$ corresponds to the passing probability of each state at clock time 1 that is computed sequentially on an inverse time series basis from state $S_T=0$ at the coding end time by using the received value, while $\gamma_t$ corresponds to the reception probability of the output of each branch that is transferred from a state to another at clock time t as computed on the basis of the received value at clock time t and the input probability.

Then, the soft-output $\lambda_{tj}$ can be expressed by formula (8) below, using these probabilities $\alpha_t$, $\beta_t$ and $\gamma_t$.

$$\lambda_{ij} = \frac{\sum_{\substack{m',m \\ i_j(m',m)=1}} \alpha_t(m')\gamma_t(m',m)\beta_t(m)}{\sum_{\substack{m',m \\ i_j(m',m)=0}} \alpha_t(m')\gamma_t(m',m)\beta_t(m)} \quad (8)$$

Meanwhile, equation (9) below holds true for t=1, 2, . . . , T;

$$\alpha_t(m) = \sum_{m'=0}^{M-1} \alpha_{t-1}(m')\gamma_t(m', m), \quad (9)$$

where, $\alpha_0(0)=1$, $\alpha_0(m)=0 (m \neq 0)$

Similarly, equation (10) below holds true for t=1, 2, . . . , T.

$$\beta_t(m) = \sum_{m'=0}^{M-1} \beta_{t+1}(m')\gamma_{t+1}(m, m') \text{ where,} \quad (10)$$

$$\beta_T(0) = 1, \beta_T(m) = 0 (m \neq 0)$$

Likewise, as for $y_t$, equation (11) below holds true for t=1, 2, ..., T.

$$\gamma_t(m', m) = \begin{cases} P_t(m \mid m') \cdot Pr\{y_i \mid x(m', m)\} = \\ Pr\{i_t = i(m', m)\} \cdot Pr\{y_i \mid x(m', m)\} \\ \quad :{}^*1 \\ 0 :{}^*2 \end{cases} \quad (11)$$

$:{}^*1$: for transition from $m'$ to $m$ at input $i$ $:{}^*2$: for non-transition from $m'$ to $m$ at input $i$ Therefore, the decoder 203 determines soft-output $\lambda_t$ by following the steps shown in FIG. 3 for soft-output decoding, applying the BCJR algorithm.

Referring to FIG. 3, firstly in Step S201, the decoder 203 computes the probability $\alpha_t(m)$ and the probability $\gamma_t(m', m)$, using the above equations (9) and (11) respectively, each time it receives $\gamma_t$.

Then in Step S202, after receiving all the system $Y_1^T$, the decoder 203 computes the probability $\beta_t(m)$ for each state m at all clock times t, using the above equation (10).

Subsequently in Step S203, the decoder 203 computes the soft-output $\lambda_t$ at each clock time t, substituting the probabilities $\alpha_t$, $\beta_t$ and $\gamma_t$ obtained respectively in Steps S201 and S202 for the above equation (8).

Thus, the decoder 203 can decodes the soft-output obtained by applying the BCJR algorithm and following the above processing steps.

However, the above described BCJR algorithm requires computations to be made by directly holding probability values and the computations involve a large number of operations of multiplication, which by turn entails a problem of a large volume of computing operation. Robertson, Villebrun and Hoeher, "A comparison of optimal and sub-optimal MAP decoding algorithms operating in the domain", IEEE Int. Conf. On Communications, pp. 1009–1013, June 1995, describes a technique for reducing the volume of computing operation by using a Max-Log-MAP algorithm and a Log-MAP algorithm (to be respectively referred to as Max-Log-BCJR algorithm and Log-BCJR algorithm hereinafter).

Firstly, the Max-Log-BCJR algorithm will be described. The Max-Log-BCJR algorithm is designed to express the probabilities $\alpha_t$, $\beta_t$ and $\gamma_t$ and the soft-output $\lambda_t$ in terms of natural logarithm in order to replace the multiplications for computing the probabilities with additions of natural logarithm in a manner as indicated by formula (12) and the additions for the probabilities are approximated by operations for computing maximum values, using formula (13) below. Note that, max (x, y) in formula (13) is a function selecting the larger value of ether x or y.

$$\log(e^x \cdot e^y) = x+y \quad (12)$$

$$\log(e^x + e^y) \cong \max(x,y) \quad (13)$$

Now, for the purpose of simplicity, natural logarithm is denoted by I and the values of $\alpha_t$, $\beta_t$, $\gamma_t$ and $\lambda_t$ as expressed in the form of natural logarithm are denoted respectively by $I\alpha_t$, $I\beta_t$, $I\gamma_t$ and $I\lambda_t$ as shown in formula (14) below.

$$\begin{cases} I\alpha_t(m) = \log(\alpha_t(m)) \\ I\beta_t(m) = \log(\beta_t(m)) \\ I\gamma_t(m) = \log(\gamma_t(m)) \\ I\lambda_t = \log\lambda_t \end{cases} \quad (14)$$

With the Max-Log-BCJR algorithm, the log likelihoods $I\alpha_t$, $I\beta_t$, $I\gamma_t$ are approximated by formulas (15) through (17) shown below. Note that maximum value max of the right side of formula (15) in state m' is determined in state m' where a transition to state m exists. Similarly, maximum value max of the right side of formula (16) in state m' is determined in state m' where a transition from state m exists.

$$I\alpha_t(m) \cong \max_{m'}(I\alpha_{t-1}(m') + I\gamma_t(m', m)) \quad (15)$$

$$I\beta_t(m) \cong \max_{m'}(I\beta_{t+1}(m') + I\gamma_{t+1}(m, m')) \quad (16)$$

$$I\gamma_t(m',m) = \log(Pr\{i_t=i(m',m)\}) + \log(Pr\{y_t|x(m',m)\}) \quad (17)$$

Additionally, with the Max-Log-BCJR algorithm, the log soft-output $I\lambda_t$ is approximated by formula (18) shown below. Note that maximum value max of the first term of the right side in formula (15) is determined in state m' where a transition to state m exists when the input is equal to "0".

$$I\lambda_{ij} \cong \max_{\substack{m',m \\ i_j(m',m)=1}} (I\alpha_{t-1}(m') + I\gamma_t(m', m) + I\beta_t(m)) - \max_{\substack{m',m \\ i_j(m',m)=0}} (I\alpha_{t-1}(m') + I\gamma_t(m', m) + I\beta_t(m)) \quad (18)$$

When the decoder 203 decodes the soft-output, applying the Max-Log-BCJR algorithm, it determines the soft-output $\lambda_t$ on the basis of these relationships, by following the steps shown in FIG. 4.

Referring to FIG. 4, firstly in Step S211, the decoder 203 computes the log likelihood $I\alpha_t(m)$ and the log likelihood $I\gamma_t(m', m)$, using the above equations (15) and (17) respectively, each time it receives $y_t$.

Then in Step S212, after receiving all the system $Y_1^T$, the decoder 203 computes the log likelihood $I\beta_t(m)$ for each state m at all clock times t, using the above equation (16).

Subsequently in Step S213, the decoder 203 computes the log soft-output $I\lambda_t$ at each clock time t, substituting the log likelihoods $I\alpha_t$, $I\beta_t$ and $I\gamma_t$ obtained respectively in Steps S211 and S212 for the above equation (18).

Thus, the decoder 203 can decodes the soft-output obtained by applying the Max-Log-BCJR algorithm and following the above processing steps.

Because the Max-Log-BCJR algorithm does not involve multiplications, it can considerably reduce the volume of operation if compared with the BCJR algorithm.

Now, the Log-BCJR algorithm will be described below. The Log-BCJR algorithm is designed to improve the accuracy of approximation of the Max-Log-BCJR algorithm. More specifically, with the Log-BCJR algorithm, the probability addition of the above formula (13) is modified to produce formula (19) below by adding a correction term to make the sum of the logarithmic addition more accurate. The correction will be referred to as log-sum correction hereinafter.

$$\log(e^x + e^y) = \max(x, y) + \log(1 + e^{-|x-y|}) \quad (19)$$

The operation of the left side of the above formula (19) is referred to as log-sum operation and, for the sake of convenience, the operator of the log-sum operation is expressed by "#" as shown in formula (20) below by following the numeration system described in S. S. Pietrobon, "Implementation and performance of a turbo/MAP decoder", Int. J. Satellite Commun., vol. 16, pp. 23–46, January–February 1998 (although "E" is used to denote the operator in the above identified paper). Additionally, the operator of the cumulative addition of log-sum operations is expressed by "#Σ" as shown in formula (21) below (although "E" is used in the above identified paper).

$$x \# y = \log(e^x + e^y) \quad (20)$$

$$\#\sum_{i=0}^{M-1} x_i = ((\ldots((x_0 \# x_1) \# x_2) \ldots) \# x_{M-1}) \quad (21)$$

The log likelihoods $I\alpha_t$ and $I\beta_t$ and the log soft-output $I\lambda_t$ of the Log-BCJR algorithm are expressed respectively by formulas (22) through (24) below using these operators. Since the expression of (17) is also used for the log likelihood $I\gamma_t$ here, it will not be described any further.

$$I\alpha_t(m) = \#\sum_{m'=0}^{M-1} (I\alpha_{t-1}(m') + I\gamma_t(m', m)) \quad (22)$$

$$I\beta_t(m) = \#\sum_{m'=0}^{M-1} (I\beta_{t+1}(m') + I\gamma_{t+1}(m, m')) \quad (23)$$

$$I\lambda_{tj} = \#\sum_{\substack{m',m \\ i_j(m',m)=1}} (I\alpha_{t-1}(m') + I\gamma_t(m', m) + I\beta_t(m)) - \quad (24)$$

$$\#\sum_{\substack{m',m \\ i_j(m',m)=0}} (I\alpha_{t-1}(m') + I\gamma_t(m', m) + I\beta_t(m))$$

Note that the cumulative addition of log-sum operations in state m' of the right side of the above formula (22) is conducted in state m' where a transition to state m exists, whereas the cumulative addition of log-sum operations in state m' of the right side of the above formula (23) is conducted in state m' where a transition from state m exists. Furthermore, the cumulative addition of log-sum operations of the first term of the right side in formula (24) is conducted in state m' where a transition to state m exists when the input is equal to "1", and the cumulative addition of log-sum operations of the second term is conducted in state m' where a transition to state m exists when the input is equal to "0".

When the decoder 203 decodes the soft-output, applying the Log-BCJR algorithm, it determines the soft-output $\lambda_t$ on the basis of these relationships, by following the steps shown in FIG. 4.

Referring to FIG. 4, firstly in Step S211, the decoder 203 computes the log likelihood $I\alpha_t(m)$ and the log likelihood $I\gamma_t(m', m)$, using the above equations (22) and (17) respectively, each time it receives $y_t$.

Then in Step S212, after receiving all the system $Y_1^T$, the decoder 203 computes the log likelihood $I\beta_t(m)$ for each state m at all clock times t, using the above equation (23).

Subsequently in Step S213, the decoder 203 computes the log soft-output $I\lambda_t$ at each clock time t, substituting the log likelihoods $I\alpha_t$, $I\beta_t$ and $I\gamma_t$ obtained respectively in Steps S211 and S212 for the above equation (24).

Thus, the decoder 203 can decodes the soft-output obtained by applying the Log-BCJR algorithm and following the above processing steps. Since the correction term, or the second term, of the right side of the above formula (19) is expressed by means of a linear function of variable |x−y|, it is possible to accurately compute probabilities by storing in advance the values that the term can take in a ROM (not shown).

While the Log-BCJR algorithm may entail a volume of operation that is greater than the Max-Log-BCJR algorithm, it does not involve any multiplications and its output is exactly the logarithmic value of the soft-output of the BCJR algorithm if the quantization error is eliminated.

Meanwhile, the above described log likelihood $I\gamma_t$ comprises a priori probability information shown in the first term and probability information (to be referred to as channel value hereinafter) obtained from the received value $y_t$ of the second term of the right side of the above equation (17).

With the Max-Log-BCJR algorithm and the Log-BCJR algorithm, it is also possible to use a log likelihood ratio that is a natural log value of the ratio of two probabilities. Then, the log likelihood $I\gamma_t$ can be expressed by formula (25) below. More specifically, the log likelihood $I\gamma_t$ can be expressed by using a priori probability information that is the cumulative sum of multiplication products of the natural log values of the log likelihood ratios of probability $\Pr\{i_{tj}=1\}$ and probability $\Pr\{i_{tj}=0\}$ and input $i_j(m', m)$, and a channel value that is the cumulative sum of multiplication products of the natural log values of the log likelihood ratios of probability $\Pr\{y_{tj}|x_{tj}=1\}$ and the probability $\Pr\{y_{tj}|x_{tj}=0\}$ and output $x_j(m', m)$.

$$I\gamma_t = \sum_{j=1}^{k} i_j(m', m) \cdot \log \frac{\Pr\{i_{tj}=1\}}{\Pr\{i_{tj}=0\}} + \quad (25)$$

$$\sum_{j=1}^{n} x_j(m', m) \cdot \log \frac{\Pr\{y_{tj}|x_{tj}=1\}}{\Pr\{y_{tj}|x_{tj}=0\}}$$

If it is assumed that additive white Gaussian noise (AWGN) is added to the output $x_{tj}$ of the encoder 201 by the memoryless communication channel 202, the second term of the above formula (25) can be developed in a manner as shown by formula (26) below. Note that "A" in the formula (26) represents the received value $y_{tj}$ that maximizes the probability $\Pr\{y_{tj}|x_{tj}=1\}$ or, in other words, the average value of the normal distribution that the probability density function using the received value $y_{tj}$ as variable follows and "σ²" represents the variance of the normal distribution. The received value $y_{tj}$ that maximizes the probability $\Pr\{y_{tj}|x_{tj}=0\}$ is expressed by "−A". In reality, "A" and "−A" are the transmission amplitudes of the outputs $x_{tj}=1$, 0 from the encoder 201.

$$\log \frac{\Pr\{y_{tj} | x_{tj} = 1\}}{\Pr\{y_{tj} | x_{tj} = 0\}} = \log \frac{\frac{1}{\sqrt{2\pi\sigma^2}} e^{-\frac{(y_{tj}-A)^2}{2\sigma^2}}}{\frac{1}{\sqrt{2\pi\sigma^2}} e^{-\frac{(y_{tj}+A)^2}{2\sigma^2}}} \quad (26)$$

$$= \log e^{\left(\frac{(y_{tj}+A)^2}{2\sigma^2} - \frac{(y_{tj}-A)^2}{2\sigma^2}\right)}$$

$$= \frac{(y_{tj}+A)^2}{2\sigma^2} - \frac{(y_{tj}-A)^2}{2\sigma^2} = \frac{2A}{\sigma^2} y_{tj}$$

Thus, the decoder 203 can directly obtain the channel value from the received value $y_t$ by knowing the characteristics of the memoryless communication channel 202. More specifically, the Iγ computation circuit for computing the log likelihood Iγ$_t$ of the decoder 203 can be composed of only an adder as shown in FIG. 6. In other words, the decoder 203 can determine the channel value by multiplying the received value $y_{tj}$ by a predetermined coefficient AMP and then the log likelihood Iγ$_t$ by adding the channel value and a priori probability information (which is denoted by APP in FIG. 6 and will be referred to as a priori probability information APP hereinafter) by means of the Iγ computation circuit. Differently stated, when the decoder 203 needs to multiply the received value $y_{tj}$ by an appropriate coefficient AMP when it determines the log likelihood Iγ$_t$.

However, when a decoder 203 is actually installed as hardware, it is difficult to determine the log likelihood Iγ$_t$ by the arrangement of FIG. 6 because the quantization range is limited.

More specifically, since the coefficient AMP normally takes a value between 0.5 and 10, the distribution of the channel value obtained by multiplying the received value $y_{tj}$ by coefficient AMP varies remarkable relative to the dynamic range of a priori probability information APP. If, for example, a range between 0.5 and 8 is selected for coefficient APP, the range of distribution of the channel value obtained by multiplying the received value $y_{tj}$ by coefficient AMP can be at most 16 times as much as the dynamic range of a priori probability information APP.

Therefore, the decoder 203 cannot be provided with a dynamic range that is wide enough for satisfactorily expressing information on the received value and hence it is difficult to accurately determine the log likelihood Iγ$_t$.

Assume that the encoder 201 is one where a plurality of convolutional encoders are concatenated in parallel or in series with interleavers interposed between them for parallel concatenated convolutional coding (to be referred to as PCCC hereinafter) or serially concatenated convolutional coding (to be referred to as SCCC hereinafter) or one where PCCC or SCCC is combined with multi-valued modulation for turbo trellis coded modulation (to be referred to as TTCM hereinafter) or serial concatinated trellis coded modulation (to be referred to as SCTCM hereinafter), whichever appropriate. In this case, the decoder 203 is formed by concatenating a plurality of soft-output decoding circuits designed for maximum a poteriori probability (MAP) decoding with interleavers or deinterleavers interposed between them for the purpose of so-called iterative decoding.

Extrinsic information that is the difference between the above a posteriori probability information that corresponds to the above described soft-output or log soft-output and the a priori probability information (APP) is used as a priori probability information APP at the time of iterative decoding. In other words, a priori probability information APP is a pile of received values $y_{tj}$. When this is taken into consideration, it will not be desirable for the decoder 203 that there are fluctuations in the distribution of the received value $y_{tj}$ relative to the dynamic range of a priori probability information APP.

In other words, it will be desirable for the decoder 203 to make the resolution of a priori probability information APP or the quantization slot of a priori probability information APP variable as a function of the signal to noise ratio (S/N), while maintaining the ratio of the dynamic range of a priori probability information APP to the signal point of the received value $y_{tj}$ to a constant level.

Such a decoder 203 can be realized substantially by employing a configuration as shown in FIG. 8 for the Iγ computation circuit for computing the log likelihood Iγ$_t$. Then, the decoder 203 can determine the log likelihood Iγ$_t$ by adding the quotient obtained by dividing the a priori probability information APP by said coefficient AMP to the received value $y_{tj}$. With such an arrangement, the decoder 203 can hold the dynamic range of the received value $y_{tj}$ without relaying on the coefficient AMP.

However, if "0.5" is selected for the coefficient AMP, the range that can be used for expressing a priori probability information APP extends between –2×Max and 2×Max relative to the upper limit (Max) and the lower limit (–Max) of the quantization range of the received value $y_{tj}$, if "8" is selected for the coefficient AMP, the range to be used for expressing a priori probability information APP extends between (–⅛)×Max and (⅛)×Max. In other words, the range that can be used for expressing a priori probability information APP becomes variable. Additionally, the quantization slot of a priori probability information APP also becomes variable. Thus, if a priori probability information APP becomes very fine and goes beyond the allowable range of quantization, it will be no longer possible to express a priori probability information APP.

In this way, when the resolution of a priori probability information APP is modified, there may arise occasions where a priori probability information APP can no longer be expressed to make it impossible to accurately determine the log likelihood Iγ$_t$, although a dynamic range can be secured for the received value $y_{tj}$.

DISCLOSURE OF THE INVENTION

In view of the above identified circumstances, it is therefore the object of the present invention to provide a decoder and a decoding method that can select an optimal dynamic range and an optimal quantization slot when the input needs to be made with a fixed number of bits.

In an aspect of the invention, the above object is achieved by providing a decoder adapted to determine a log likelihood expressing the probability of passing a state in the form of log ratio on the basis of the received value as soft-input for decoding by using the log likelihood, characterized by comprising: a soft-output decoding means for receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, for the purpose of soft-output decoding; said soft-output decoding means generating a log soft-output describing the soft-output at each clock time in a logarithmic form and/or extrinsic information by using a third additive coefficient for regulating the amplitude at the time of arithmetic operation in the inside of the soft-output decoding means.

Therefore, a decoder according to the present invention and having the above defined configuration receives the first probability information obtained by regulating the amplitude of the received value and the second probability information obtained by regulating the amplitude of the a priori probability information by the soft-output decoding means and generates a log soft-output and/or extrinsic information by using the first additive coefficient, the second additive coefficient and the third additive coefficient.

In another aspect of the invention, there is provided a decoding method adapted to determine a log likelihood expressing the probability of passing a state in the form of log ratio on the basis of the received value as soft-input for decoding by using the log likelihood, characterized by comprising: a soft-output decoding step of receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, and generating a log soft-output describing the soft-output at each clock time in a logarithmic form and/or extrinsic information by using a third additive coefficient for regulating the amplitude at the time of arithmetic operation in the inside for the purpose of soft-output decoding.

Therefore, a decoding method according to the present invention and having the above described soft-output decoding step is adapted to receive the first probability information obtained by regulating the amplitude of the received value and the second probability information obtained by regulating the amplitude of the a priori probability information and generate a log soft-output and/or extrinsic information by using the first additive coefficient, the second additive coefficient and the third additive coefficient in said soft-output decoding step.

In still another aspect of the invention, there is provided a decoder for iteratively decoding a code generated by concatenating a plurality of element codes, said decoder being adapted to determine a log likelihood expressing the probability of passing a state in the form of log ratio on the basis of the received value as soft-input for decoding by using the log likelihood, characterized by comprising: a plurality of concatenated soft-output decoding means for receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, for the purpose of soft-output decoding; each of said soft-output decoding means generating a log soft-output describing the soft-output at each clock time in a logarithmic form and/or extrinsic information by using a third additive coefficient for regulating the amplitude at the time of arithmetic operation in the inside of the soft-output decoding means and outputting the generated extrinsic information as a priori probability information of the immediately succeeding soft-output decoding means.

Therefore, a decoder according to the present invention and having the above defined configuration receives the first probability information obtained by regulating the amplitude of the received value and the second probability information obtained by regulating the amplitude of the a priori probability information by the soft-output decoding means, generates a log soft-output and/or extrinsic information by using the first additive coefficient, the second additive coefficient and the third additive coefficient and outputs the generated extrinsic information as a priori probability information of the immediately succeeding soft-output decoding means.

In still another aspect of the invention, there is provided a decoding method for iteratively decoding a code generated by concatenating a plurality of element codes, said method being adapted to determine a log likelihood expressing the probability of passing a state in the form of log ratio on the basis of the received value as soft-input for decoding by using the log likelihood, characterized by comprising: a plurality of consecutive soft-output decoding steps of receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, generating a log soft-output describing the soft-output at each clock time in a logarithmic form and/or extrinsic information by using a third additive coefficient for regulating the amplitude at the time of arithmetic operation in the inside and outputting the generated extrinsic information as a priori probability information of the immediately succeeding soft-output decoding steps for the purpose of soft-output decoding.

Therefore, a decoding method according to the present invention and having the above described soft-output decoding step is adapted to receive the first probability information obtained by regulating the amplitude of the received value and the second probability information obtained by regulating the amplitude of the a priori probability information, generate a log soft-output and/or extrinsic information by using the first additive coefficient, the second additive coefficient and the third additive coefficient and outputting the generated extrinsic information as a priori probability information of the immediately succeeding soft-output decoding means in said soft-output decoding step.

Thus, a decoder according to the first aspect of the invention and adapted to determine a log likelihood expressing the probability of passing a state in the form of log ratio on the basis of the received value as soft-input for decoding by using the log likelihood is characterized by comprising:

a soft-output decoding means for receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, for the purpose of soft-output decoding; said soft-output decoding means generating a log soft-output describing the soft-output at each clock time in a logarithmic form and/or extrinsic information by using the first additive coefficient, the second additive coefficient, and a third additive coefficient for regulating the amplitude at the time of arithmetic operation in the inside of the soft-output decoding means.

Therefore, a decoder according to the present invention and having the above defined configuration receives the first probability information obtained by regulating the amplitude of the received value and the second probability information obtained by regulating the amplitude of the a priori probability information by the soft-output decoding means and generates a log soft-output and/or extrinsic information by using the first additive coefficient, the second additive coefficient and the third additive coefficient so that it can selects an optimal quantization slot necessary for the internal arithmetic operations of the soft-output decoding means that are conducted to optimally generate a dynamic range and a quantization slot relative to the information input to the soft-output decoding that requires inputs of a fixed number of bits and also extrinsic information.

Thus, a decoding method according to the second aspect of the invention and adapted to determine a log likelihood expressing the probability of passing a state in the form of log ratio on the basis of the received value as soft-input for decoding by using the log likelihood is characterized by comprising: a soft-output decoding step of receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, and generating a log soft-output describing the soft-output at each clock time in a logarithmic form and/or extrinsic information by using the first additive coefficient, the second additive coefficient, and a third additive coefficient for regulating the amplitude at the time of arithmetic operation in the inside for the purpose of soft-output decoding.

Therefore, a decoding method according to the present invention and having the above described soft-output decoding step is adapted to receive the first probability information obtained by regulating the amplitude of the received value and the second probability information obtained by regulating the amplitude of the a priori probability information and generate a log soft-output and/or extrinsic information by using the first additive coefficient, the second additive coefficient and the third additive coefficient in said soft-output decoding step so that it can selects an optimal quantization slot necessary for the internal arithmetic operations in the soft-output decoding steps that are conducted to optimally generate a dynamic range and a quantization slot relative to the information input to the soft-output decoding that requires inputs of a fixed number of bits and also extrinsic information.

Thus, a decoder for iteratively decoding a code generated by concatenating a plurality of element codes according to the third aspect of the invention, said decoder being adapted to determine a log likelihood expressing the probability of passing a state in the form of log ratio on the basis of the received value as soft-input for decoding by using the log likelihood, is characterized by comprising: a plurality of concatenated soft-output decoding means for receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, for the purpose of soft-output decoding; each of said soft-output decoding means generating a log soft-output describing the soft-output at each clock time in a logarithmic form and/or extrinsic information by using a third additive coefficient for regulating the amplitude at the time of arithmetic operation in the inside of the soft-output decoding means and outputting the generated extrinsic information as a priori probability information of the immediately succeeding soft-output decoding means.

Therefore, a decoder according to the present invention and having the above defined configuration receives the first probability information obtained by regulating the amplitude of the received value and the second probability information obtained by regulating the amplitude of the a priori probability information by the soft-output decoding means, generates a log soft-output and/or extrinsic information by using the first additive coefficient, the second additive coefficient and the third additive coefficient and outputs the generated extrinsic information as a priori probability information of the immediately succeeding soft-output decoding means so that it can selects an optimal quantization slot necessary for the internal arithmetic operations of the soft-output decoding means that are conducted to optimally generate a dynamic range and a quantization slot relative to the information input to the soft-output decoding means that requires inputs of a fixed number of bits and also extrinsic information.

Thus, a decoding method for iteratively decoding a code generated by concatenating a plurality of element codes according to the fourth aspect of the invention, said method being adapted to determine a log likelihood expressing the probability of passing a state in the form of log ratio on the basis of the received value as soft-input for decoding by using the log likelihood, is characterized by comprising: a plurality of consecutive soft-output decoding steps of receiving as input first probability information obtained by dividing the channel value by a first additive coefficient for regulating the amplitude of the received value, said channel value being produced by multiplying the received value by a predetermined coefficient, said first additive coefficient being adapted to be used for multiplying only the received value, and second probability information obtained by multiplying a priori probability information by the reciprocal of a second additive coefficient, said second additive coefficient being adapted to regulate the amplitude of the a priori probability information by multiplying only the a priori probability information, generating a log soft-output describing the soft-output at each clock time in a logarithmic form and/or extrinsic information by using the first additive coefficient, the second additive coefficient, and a third additive coefficient for regulating the amplitude at the time of arithmetic operation in the inside and outputting the generated extrinsic information as a priori probability information of the immediately succeeding soft-output decoding steps for the purpose of soft-output decoding.

Therefore, a decoding method according to the present invention and having the above described soft-output decoding step is adapted to receive the first probability information obtained by regulating the amplitude of the received value and the second probability information obtained by regulating the amplitude of the a priori probability information, generate a log soft-output and/or extrinsic information by using the first additive coefficient, the second additive coefficient and the third additive coefficient and outputting the generated extrinsic information as a priori probability information of the immediately succeeding soft-output decoding means in said soft-output decoding step so that it can selects an optimal quantization slot necessary for the internal arithmetic operations in the soft-output decoding steps that are conducted to optimally generate a dynamic range and a quantization slot relative to the information input to the soft-output decoding that requires inputs of a fixed number of bits and also extrinsic information.

BRIEF DESCRIPTION OF THE DRAWINGS

FIGS. 25A and 25B are graphs illustrating normalization of distribution of received value and channel value, of which FIG. 25A is a graph illustrating the distribution before normalization where the average value is "±1" and the variance is "$\sigma^2$" and FIG. 25B is a graph illustrating the distribution after normalization.

BEST MODE FOR CARRYING OUT THE INVENTION

Now, the present invention will be described in greater detail by referring to the accompanying drawings that illustrate a preferred embodiment of the invention.

Figure 1:
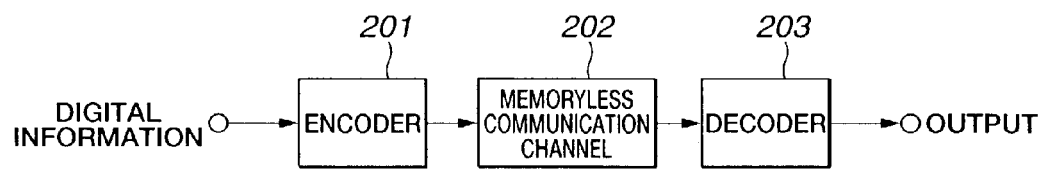
FIG. 1 is a schematic block diagram of a communication model.
Figure 2:
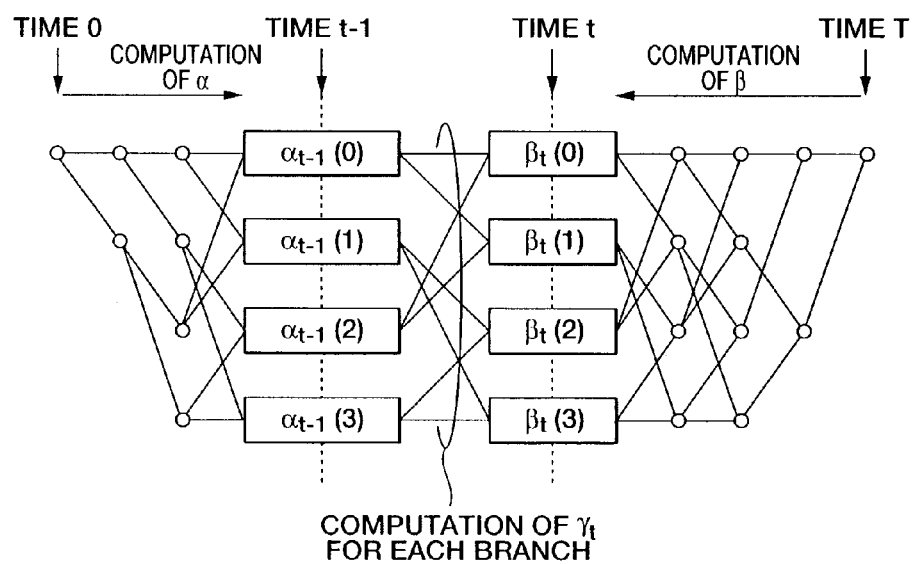
FIG. 2 is a schematic illustration of the trellis of a known encoder and probabilities $\alpha_t$, $\beta_t$ and $\gamma_t$.
Figure 3:
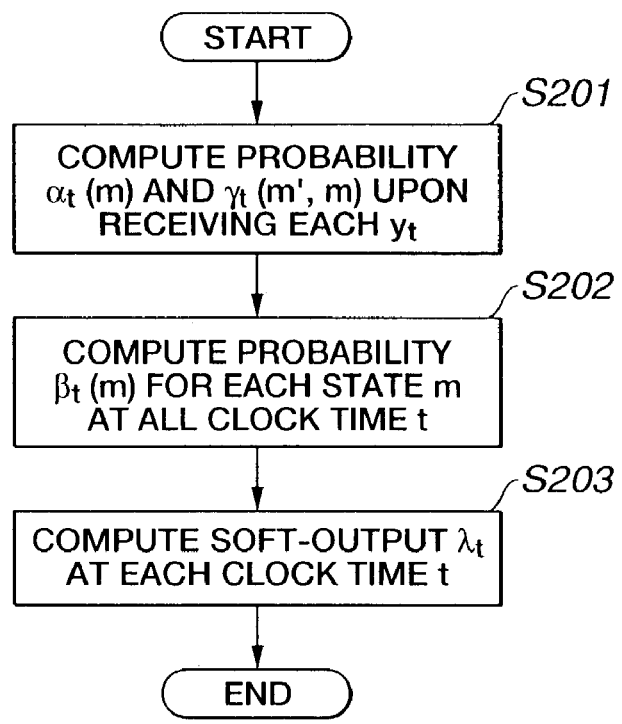
FIG. 3 is a flow chart of the sequence of operation of soft-output decoding realized by applying the BCJR algorithm in a known decoder.
Figure 4:
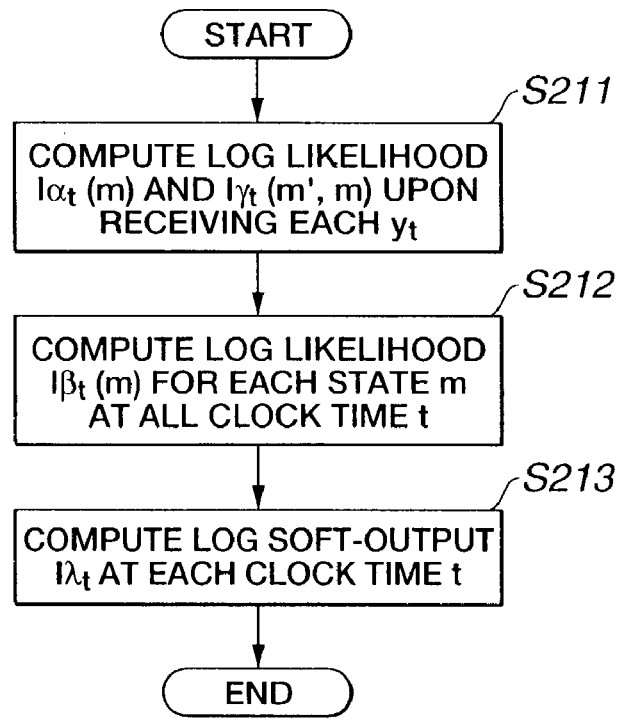
FIG. 4 is a flow chart of the sequence of operation of soft-output decoding realized by applying the Max-Log-BCJR algorithm in a known decoder.
Figure 5:
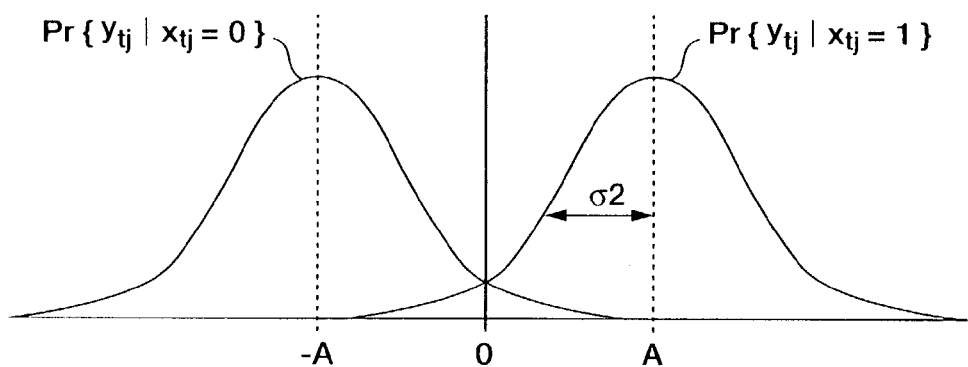
FIG. 5 is a graph illustrating a normalized distribution that a probability density function using a received value as variable follows, the average value and the variance of the normalized distribution being "±A" and "$\sigma^2$" respectively.
Figure 6:
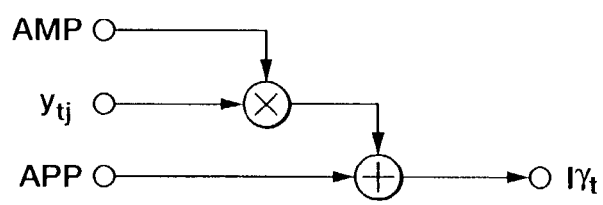
FIG. 6 is a schematic block diagram of the Iγ computation circuit of a known decoder, illustrating its substantive configuration.
Figure 7:
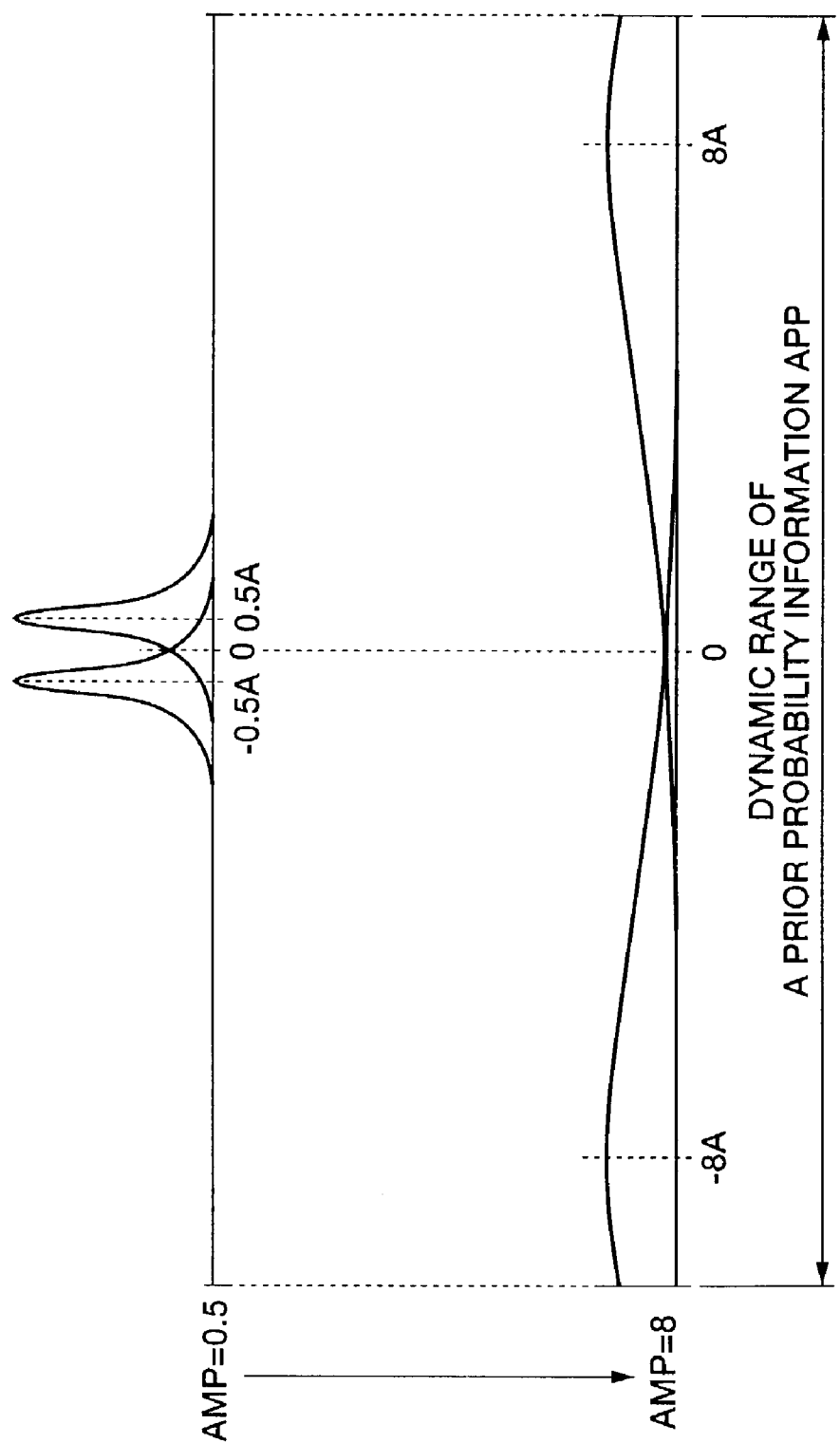
FIG. 7 is a graph illustrating the distribution of channel value obtained by multiplying the received value by a coefficient AMP and selecting a value between 0.5 and 8 for the coefficient AMP.
Figure 8:
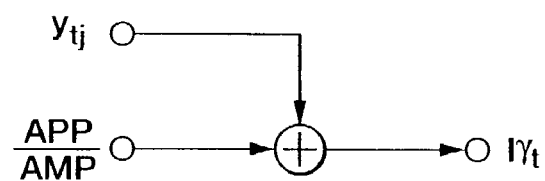
FIG. 8 is a schematic block diagram of the Iγ computation circuit of a known decoder adapted to make the quantization slot for a priori probability information variable, illustrating its substantive configuration.
Figure 9:
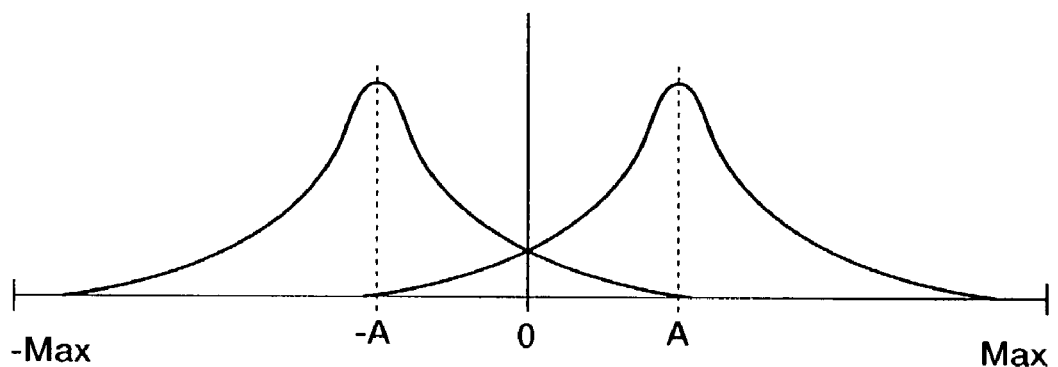
FIG. 9 is a graph illustrating the distribution of received value in a known decoder comprising the Iγ computation circuit as shown in FIG. 8.
Figure 10:
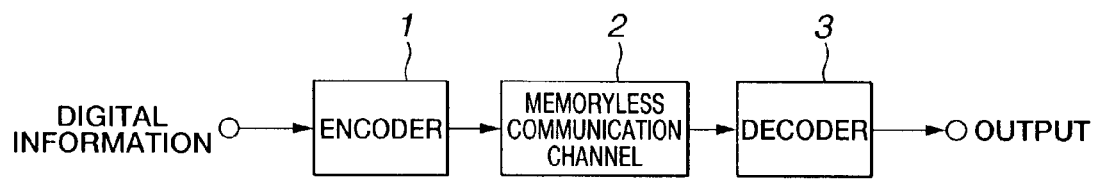
FIG. 10 is a schematic block diagram of a communication model to which an embodiment of data transmission/reception system according to the invention is applicable.

Referring firstly to FIG. 10, this embodiment is applied to a data transmission/reception system, in which having encoder 1 of a transmitter (not shown) encodes digital information and transmits it to a receiver (not shown) by way of a memoryless communication path 2 having noise so that the transmitted code is decoded by decoder 3 of the receiver.

Of the data transmission/reception system, the decoding operation of the decoder 3 for decoding the code encoded by the encoder 1 is a maximum a posteriori probability (to be referred to as MAP hereinafter) decoding operation that is conducted on the basis of the Max-Log-MAP algorithm or the Log-MAP algorithm (to be referred to as Max-Log-BCJR algorithm or Log-BCJR algorithm, whichever appropriate, hereinafter) as described in Robertson, Villebrun and Hoeher, "A comparison of optimal and sub-optimal MAP decoding algorithms operating in the domain", IEEE Int. Conf. On Communications, pp. 1009–1013, June 1995. In other words, it is adapted to determine probabilities $\alpha_t$, $\beta_t$, $\gamma_t$ and soft-output $\lambda_t$ respectively as log likelihoods $I\alpha_t$, $I\beta_t$, $I\gamma_t$ that are expressed in the form of log likelihood by using natural logarithm and log soft-output $I\lambda_t$ that corresponds to so-called a posteriori probability information. Particularly, the decoder 3 is adapted to optimally select a dynamic range and a quantization slot for the received value that needs to be input with a fixed number of bits and so-called a priori probability information and also a quantization slot necessary for internal arithmetic operations in order to generate extrinsic information.

Note that, in the following description, the decoder 3 decodes codes on the basis of the Log-BCJR algorithm. Also the following assumptions are made. M states (transition state) representing the contents of the shift register of the encoder 11 are expressed by m (0, 1, ..., M−1) and the state at clock time t is expressed by $S_t$. Also, if a k-bit information is input in a single time slot the input at clock time t is expressed by $i_t = (i_{t1}, i_{t2}, \ldots, i_{tk})$ and the input system is expressed by $I_1^T = (i_1, i_2, \ldots, i_T)$. If there is a transition from state m' to state m, the information bit corresponding to the transition is expressed by $i(m', m) = (i_1(m', m), i_2(m', m), \ldots, i_k(m', m))$. Additionally, if an n-bit code is output in a single time slot, the output at clock time t is expressed by $X_t = (x_{t1}, x_{t2}, \ldots, x_{tn})$ and the output system is expressed by $X_1^T = (x_1, x_2, \ldots, x_T)$. If there is a transition from state m' to state m, the code bit corresponding to the transition is expressed by $X(m', m) = (x_1(m', m), x_2(m', m), \ldots, x_n(m', m))$. The memoryless communication channel 2 receives $X_1^T$ as input and produces $Y_1^T$ as output. if an n-bit received value is output in a single time slot, the output at clock time t is expressed by $Y_t = (y_{t1}, y_{t2}, \ldots, y_{tn})$ and $Y_1^T = (y_1, y_2, \ldots, y_T)$ is used.

Figure 11:
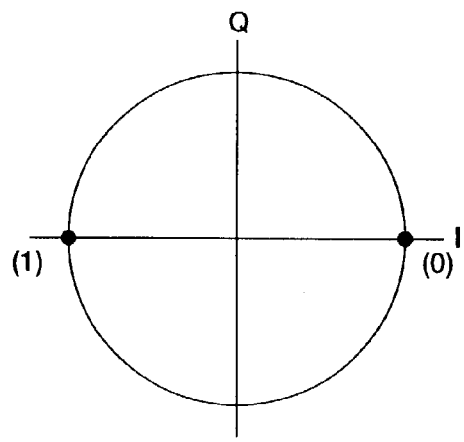
FIG. 11 is a graph illustrating the arrangement of signal points of the encoder of the data transmission/reception system of FIG. 10, using the BPSK modulation system.
Figure 12:
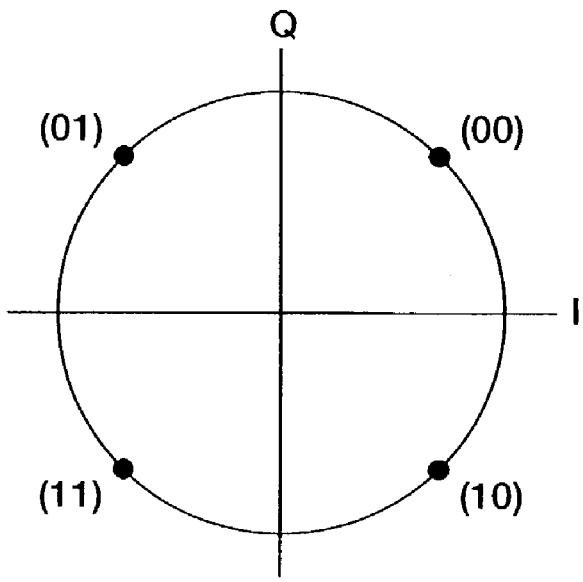
FIG. 12 is a graph illustrating the arrangement of signal points of the encoder of the data transmission/reception system of FIG. 10, using the QPSK modulation system.
Figure 13:
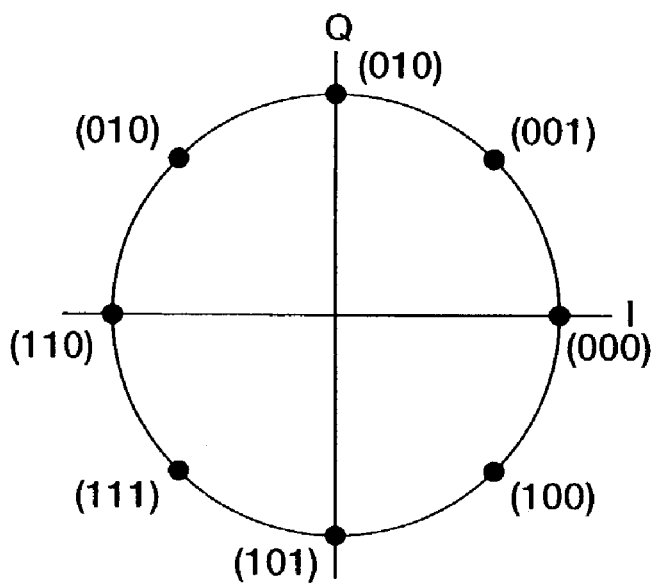
FIG. 13 is a graph illustrating the arrangement of signal points of the encoder of the data transmission/reception system of FIG. 10, using the 8PSK modulation system.

The encoder 1 is designed to modulate a code such as a convolutional code, a parallel concatenated convolutional code (to be referred to as PCCC hereinafter) or a serially concatenated convolutional code (to be referred to as SCCC hereinafter) by means of a modulation method of arranging the signal points that can provide a distribution of the received value for each bit such as the binary phase shift keying (to be referred to as BPSK hereinafter) modulation method whose signal points are illustrated in FIG. 11 or the quadrature phase shift keying (to be referred to as QPSK hereinafter) modulation method whose signal points are illustrated in FIG. 12. Alternatively, the encoder 1 may be designed to modulate a convolutional code by a modulation method of arranging the signal points that can not provide a distribution of the received value for each bit such as the 8-phase shift keying (to be referred to as 8PSK hereinafter) modulation method as shown in FIG. 13 for the purpose of trellis coded modulation (to be referred to as TCM hereinafter) that can accommodate both the arrangement of signal points and the decoding characteristics of error correction codes in an integrated manner. It is also possible to make the encoder 1 to be adapted to turbo trellis coded modulation (to be referred to as TTCM hereinafter) or serial concatenated trellis code modulation (to be referred to as SCTCM hereinafter). All these coding methods are know as turbo coding methods.

Figure 14:
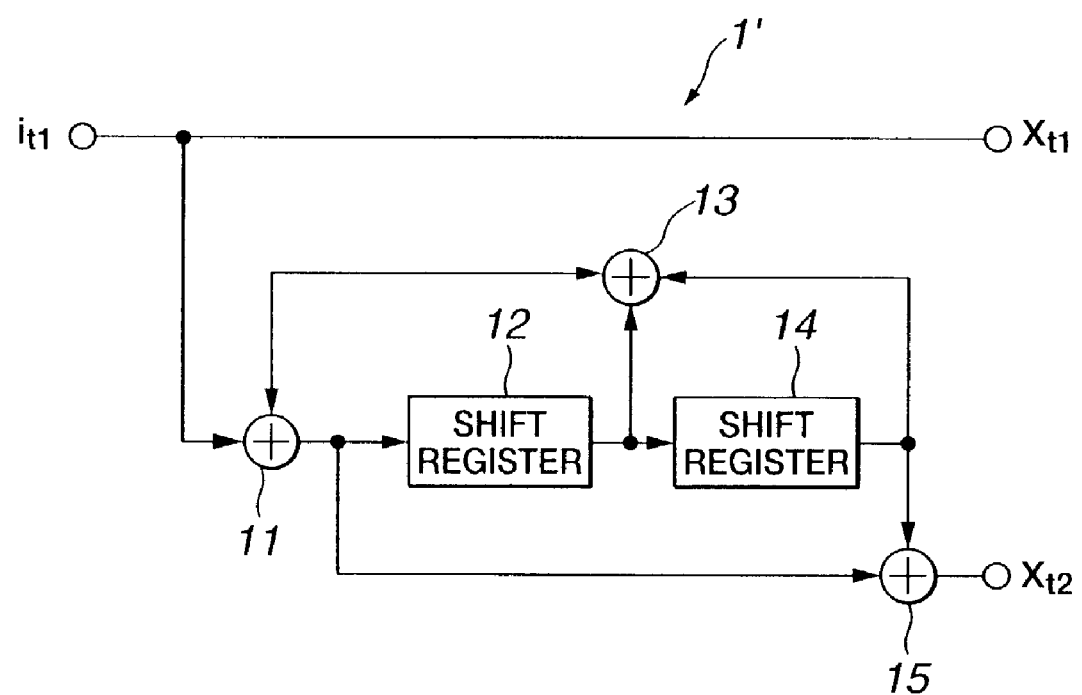
FIG. 14 is a schematic block diagram of an encoder that can be used for the data transmission/reception system of FIG. 10, illustrating its configuration.

For the purpose of simplicity, in the following description, it is assumed for the time being that an encoder 1' as shown in FIG. 14 is used. The encoder 1' comprises three exclusive-OR circuits 11, 13, 15 and two shift registers 12, 14 and is designed to perform convolutional coding operations with a constraint length of "3". It is also assumed that the encoder 1' does not discriminate the modulation methods of modulators (not shown).

The exclusive-OR circuit 11 performs an exclusive-OR operation, using a 1-bit input data $i_{t1}$ and the data supplied from the exclusive-OR circuit 13 and supplies the outcome of the operation to the shift register 12 and the exclusive-OR circuit 15.

The shift register 12 keeps on supplying the 1-bit data it holds to the exclusive-OR circuit 13 and the shift register 14. Then, the shift register 12 newly holds the 1-bit data fed from the exclusive-OR circuit 11 in synchronism with the clock and supplies the data to the exclusive-OR circuit 13 and the shift register 14.

The exclusive-OR circuit 13 performs an exclusive-OR operation, using the data fed from the shift registers 12, 14 and supplies the outcome of the operation to the exclusive-OR circuit 11.

The shift register 14 keeps on supplying the 1-bit data it holds to the exclusive-OR circuits 13, 15. Then, the shift register 14 newly holds the 1-bit data fed from the shift register 12 in synchronism with the clock and supplies the data to the exclusive-OR circuits 13, 15.

The exclusive-OR circuit 15 performs an exclusive-OR operation, using the data fed form the exclusive-OR circuit 11 and the data fed from the shift register 14 and outputs the outcome of the operation as 1-bit output data $x_{t2}$ out of 2-bit output data $X_t$.

Upon receiving a 1-bit input data $i_{t1}$ as input, the encoder 1' externally outputs the input data without modifying it as systematic component 1-bit output data $x_{t1}$ of 2-bit output data $X_t$ and, at the same time, performs a recursive convolutional coding operation on the input data $i_{t1}$. Then, it externally outputs the outcome of the operation as the other 1-bit output data $x_{t2}$ out of 2-bit output data $X_t$. In other words, the encoder 1' performs a recursive convolutional coding operation with a coding ratio of "1/2" and externally outputs the output data $X_t$.

Figure 15:
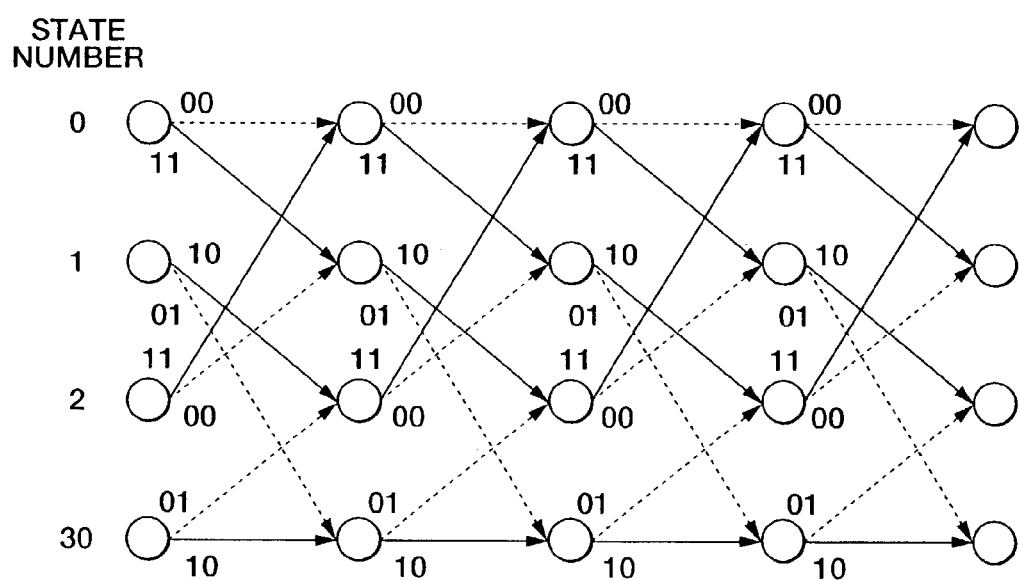
FIG. 15 is a schematic illustration of the trellis of the encoder of FIG. 14.

FIG. 15 schematically illustrates the trellis of the encoder 1'. In FIG. 15, the paths indicated by broken lines are for an input data $i_{t1}$ that is equal to "0" whereas the paths indicated by solid lines are for an input data $i_{t1}$ that is equal to "1". The label put to each path indicates 2-bit output data $X_t$. In FIG. 15, states are produced by sequentially arranging the contents of the shift register 12 and those of the shift register 14 and state numbers "00", "10", "01", "11" are expressed respectively by "0", "1", "2", "3". Thus, the number of states M of the encoder 1' is equal to 4 and two paths are used for transition from a state to the next state.

The output data $X_t$ coded by the encoder 1' is modulated by a modulator (not shown) by means of a predetermined modulation method and output to a receiver by way of the memoryless communication channel 2.

Figure 16:
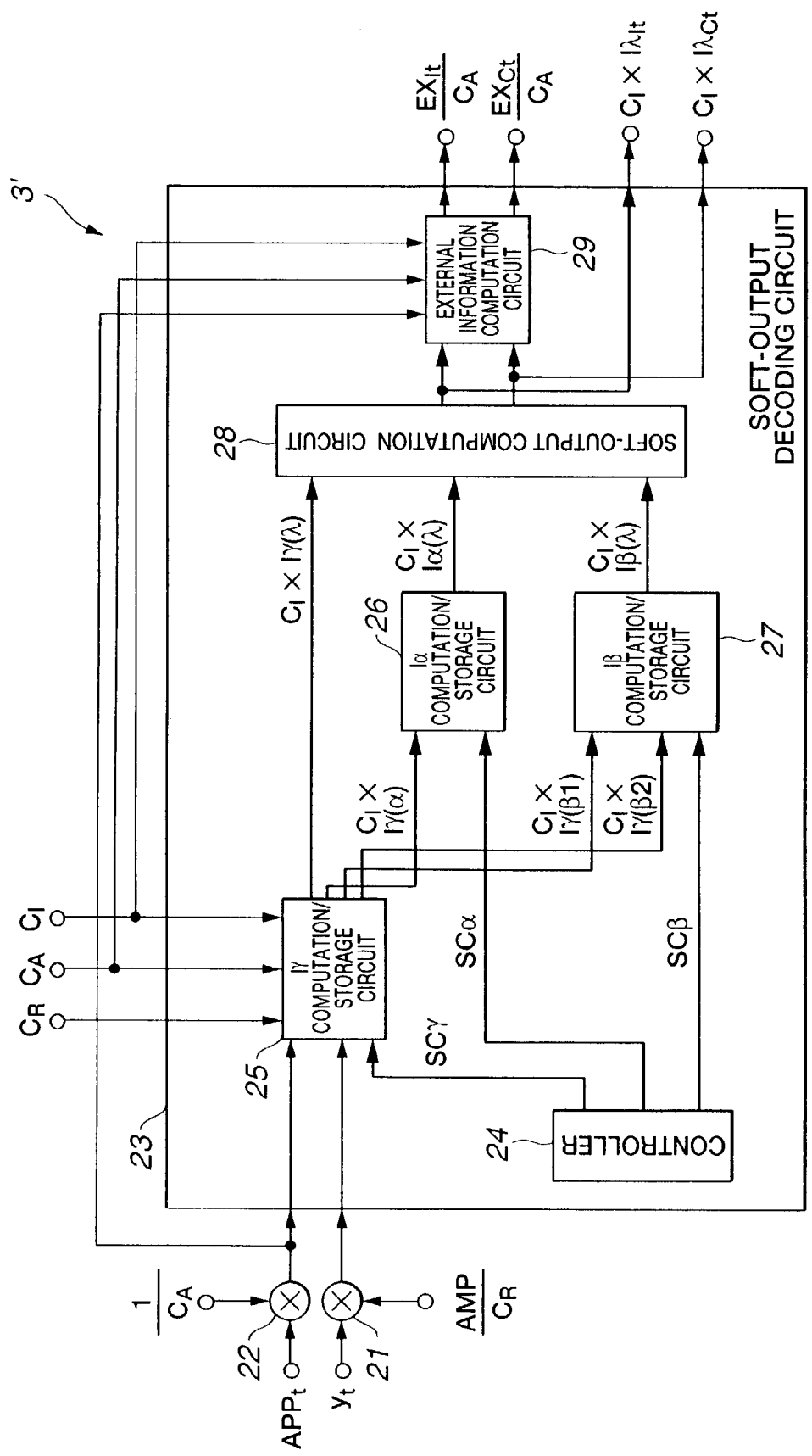
FIG. 16 is a schematic block diagram of a decoder that can be used for the data transmission/reception system of FIG. 10 and adapted to decode the codes encoded by the encoder of FIG. 14, illustrating its configuration.

On the other hand, FIG. 16 shows a decoder 3' adapted to decode the code encoded by the encoder 1'. Referring to FIG. 16, the decoder 3' comprises two multipliers 21, 22 and a soft-output decoding circuit 23 operating as soft-output decoding means. The decoder 3' is adapted to estimate the input data $i_{t1}$ of the encoder 1' by determining the log soft-output $I\lambda_t$ from the received value $y_t$ that is reduced as soft-input under the influence of the noise generated on the memoryless communication channel 2.

If it is assumed that additive white Gaussian noise (to be referred to as AWGN hereinafter) is added by the memoryless communication channel 2, the multiplier 21 multiplies the value $AMP/C_R$ obtained by dividing the predetermined coefficient AMP by the first additive coefficient $C_R$ by which only the received value $y_t$ is multiplied to regulate the amplitude of the received value $y_t$ by the received value $y_t$. In other words, the multiplier 21 generates probability information $AMP/C_R \times y_t$ that is the first probability information obtained by dividing the probability information (to be referred to as channel value hereinafter) $AMP \times y_{tj}$, which is acquired from the received value $y_{tj}$ by multiplying the received value $y_t$ by the coefficient AMP, by the first additive coefficient $C_R$. Then, the multiplier 21 supplies the probability information $AMP/C_R \times y_t$ obtained as a result of the multiplication to the soft-output decoding circuit 23.

The multiplier 22 multiplies the a priori probability information $APP_t$ by $1/C_A$, which is the reciprocal of the second additive coefficient $C_A$ to be used as multiplier for multiplying only the a priori probability information $APP_t$ in order to regulate the amplitude of the a priori probability information $APP_t$. Then, the multiplier 22 supplies the second probability information $1/C_A \times APP_t$ to the soft-output decoding circuit 23. The a priori probability information $APP_t$ is given as the log likelihood ratio that is a natural log value expressing the ratio of the probability $\Pr\{i_{t1}=1\}$ that the input data $i_{t1}$ is equal to "1" to the probability $\Pr\{i_{t1}=0\}$ that the input data $i_{t1}$ is equal to "0". The a priori probability information $APP_t$ is give as probability $\Pr\{i_{t1}=1\}$ or probability $\Pr\{i_{t1}=0\}$. Because the sum of the probability $\Pr\{i_{t1}=1\}$ and the probability $\Pr\{i_{t1}=0\}$ is equal to "1", the a priori probability information $APP_t$ may be determined as the difference of the natural log value of the probability $\Pr\{i_{t1}=1\}$ and the natural log value $\Pr\{i_{t1}=0\}$.

$$APP_t = \log \frac{\Pr\{i_{t1} = 1\}}{\Pr\{i_{t1} = 0\}} \quad (27)$$

The soft-output decoding circuit 23 is formed as a large scale integerated circuit (to be referred to as LSI hereinafter) by arranging integrally all the components on a single semiconductor substrate. The soft-output decoding circuit 23 comprises a controller 24, an $I\gamma$ computation/storage circuit 25 operating as first probability computing means for computing and storing the first log likelihood $I\gamma$, an $I\alpha$ computation/storage circuit 26 operating as second probability computing means for computing and storing the second log likelihood $I\alpha$, an $I\beta$ computation/storage circuit 27 operating as third probability computing means for computing and storing the third log likelihood $I\beta$, a soft-output computation circuit 28 operating as soft-output computing means for computing the log soft-output $I\lambda_t$ and an external information computation circuit 29 operating as external information computing means for computing external information $EX_t$.

The controller 24 supplies control signals $SC\gamma$, $SC\alpha$ and $SC\beta$ respectively to the $I\gamma$ computation/storage circuit 25, $I\alpha$ computation/storage circuit 26 and the $I\beta$ computation/storage circuit 27 to control the operation of each of these circuits.

The $I\gamma$ computation/storage circuit 25 performs under the control of the control signal $SC\gamma$ fed from the controller 24 an arithmetic operation of formula (28) for each received value $y_t$, using the probability information $AMP/C_R \times y_{tj}$ fed from the multiplier 21, the probability information $1/C_A \times APP_t$ fed from the multiplier 22, the first additive coefficient $C_R$, the second additive coefficient $C_A$ and the third additive coefficient $C_I$ by which both the received value $y_t$ and the a priori probability information $APP_t$ are multiplied to regulate the amplitude of arithmetic operation in the inside of the soft-output decoding circuit 23 and computes the log likelihood $C_I \times I\gamma_t$ whose amplitude is regulated at each clock time t. It then stores the computed log likelihood $C_I \times I\gamma_t$. In other words, the $I\gamma$ computation/storage circuit 25 computes the log likelihood $C_I \times I\gamma_t$ whose amplitude is regulated, wherein the log likelihood $C_I \times I\gamma_t$ being the logarithmic expression of the probability $\gamma$ that is determined for each received value $\gamma_t$ from the output pattern of code and the received value.

$$C_I \times I\gamma_t(m', m) = C_I \times \left( \sum_{j=1}^{k} i_j(m', m) \cdot \log \frac{\Pr\{i_{tI} = 1\}}{\Pr\{i_{tI} = 0\}} + \sum_{j=1}^{m} x_j(m', m) \cdot \log \frac{\Pr\{y_{tj} | x_{tj} = 1\}}{\Pr\{y_{tj} | x_{tj} = 0\}} \right) \quad (28)$$

$$= C_I \times (APP_t + AMP \times y_{tj})$$

Figure 17:
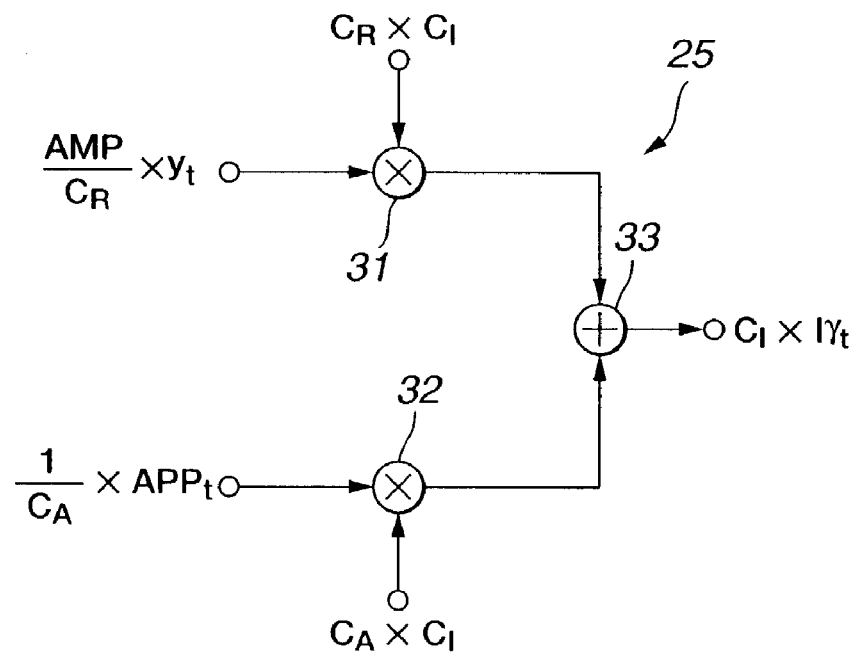
FIG. 17 is a schematic block diagram of the Iγ computation/storage circuit of the decoder of FIG. 16, illustrating its substantive configuration.

More specifically, as shown in FIG. 17, the $I\gamma$ computation/storage circuit 25 comprises as substantive components two multipliers 31, 32, or first and second multiplying means, and an adder 33, or an adding means.

The $I\gamma$ computation/storage circuit 25 multiplies the probability information $AMP/C_R \times y_{tj}$ fed from the multiplier 21 by the product of multiplication of the first additive coefficient $C_R$ and the third additive coefficient $C_I$ by means of the multiplier 31 and supplies the adder 33 with the obtained result. At the same time, the $I\gamma$ computation/storage circuit 25 multiplies the probability information $1/C_A \times APP_t$ fed from the multiplier 22 by the product of multiplication of the second additive coefficient $C_A$ and the third additive coefficient $C_I$ by means of the multiplier 32 and supplies the adder 33 with the obtained result. Additionally, the $I\gamma$ computation/storage circuit 25 adds the values fed from the multipliers 31, 32 by means of the adder 33 to computational determines the log likelihood $C_I \times I\gamma_t$. In other words, the $I\gamma$ computation/storage circuit 25 computationally determines the log likelihood $C_I \times I\gamma_t$ that is also expressed as $C_I \times (APP_t + AMP \times y_{tj})$. Then, the $I\gamma$ computation/storage circuit 25 stores the obtained log likelihood $C_I \times I\gamma_t$ in a storage section. Although not shown, the $I\gamma$ computation/storage circuit 25 in reality comprises as many adders as the number of states. Therefore, in the case of the above instance, it comprises four adders 33.

Then, the $I\gamma$ computation/storage circuit 25 supplies the $I\alpha$ computation/storage circuit 26, the $I\beta$ computation/storage circuit 27 and the soft-output computation circuit 28 with the log likelihood $C_I \times I\gamma_t$ it stores. At this time, the $I\gamma$ computation/storage circuit 25 supplies the log likelihood $I\gamma_t$ to the $I\alpha$ computation/storage circuit 26, the $I\beta$ computation/storage circuit 27 and the soft-output computation circuit 28 sequentially in an order suitable for the processing operations of the circuits. In the following description, the log likelihood $C_I \times I\gamma_t$ fed from the I$\gamma$ computation/storage circuit 25 to the I$\alpha$ computation/storage circuit 26 is expressed by $C_I \times I\gamma(\alpha)$ and the log likelihood $C_I \times I\gamma_t$ fed from the I$\gamma$ computation/storage circuit 25 to the I$\beta$ computation/storage circuit 27 is expressed by $C_I \times I\gamma(\alpha 1)$, $C_I \times I\gamma(\beta 2)$, while the log likelihood $C_I \times I\gamma_t$ fed from the I$\gamma$ computation/storage circuit 25 to the soft-output computation circuit 28 is expressed by $C_I \times I\gamma(\lambda)$.

The I$\alpha$ computation/storage circuit 26 performs under the control of the control signal SC$\alpha$ fed from the controller 24 an arithmetic operation of formula (29), using the log likelihood $C_I \times I\gamma(\alpha)$ fed from the I$\gamma$ computation/storage circuit 25 to determine the log likelihood $C_I \times I\alpha_t$ at each clock time and stores it in itself. Note that the operator "#" in the formula (29) indicates a so-called log-sum operation of the log likelihood of transition from state m' to state m for input "0" and also the log likelihood of transition from state m" to state m for input "1". More specifically, the I$\alpha$ computation/storage circuit 26 computationally determines the log likelihood $C_I \times I\alpha_t$ at each clock time t by performing an arithmetic operation of formula (30) below. In other words, the I$\alpha$ computation/storage circuit 26 computationally determines the log likelihood $C_I \times I\alpha_t$ whose amplitude is regulated by performing an arithmetic operation of formula (30) below on the basis of the log likelihood $C_I \times I\gamma$ at each clock time t, wherein the log likelihood $C_I \times I\alpha_t$ is a logarithmic expression of the probability $\alpha$ of transition from the state at the coding start time to each state on a time series bases for each received value $y_t$. Then, the I$\alpha$ computation/storage circuit 26 supplies the soft-output computation circuit 28 with the log likelihood $C_I \times I\alpha_t$ it stores. At this time, it supplies the log likelihood $C_I \times I\alpha_t$ in an order suitable for the processing operation of the soft-output computation circuit 28. In the following description, the log likelihood $C_I \times I\alpha_t$ supplied from the I$\alpha$ computation/storage circuit 26 to the soft-output computation circuit 28 is expressed by $C_I \times I\alpha(\lambda)$.

$$C_I \times I\alpha_t(m) = C_I \times ((I\alpha_{t-1}(m') + I\gamma_t(m', m))\# \quad (29)$$
$$(I\alpha_{t-1}(m'') + I\gamma_t(m'', m)))$$

$$C_I \times I\alpha_t(m) = C_I \times (\max(I\alpha_{t-1}(m') + I\gamma_t(m', m), I\alpha_{t-1}(m'') + \quad (30)$$
$$I\gamma_t(m', m)) +$$
$$\log(1 + e^{-|(I\alpha_{t-1}(m') + I\gamma_t(m',m)) - (I\alpha_{t-1}(m'') + I\gamma_t(m'',m))|}))$$

The I$\beta$ computation/storage circuit 27 performs under the control of the control signal SC$\beta$ fed from the controller 24 an arithmetic operation of formula (31), using the log likelihoods $C_I \times I\gamma(\beta 1)$ and $C_I \times I\gamma(\beta 2)$ fed from the I$\gamma$ computation/storage circuit 25 to determine the log likelihoods $C_I \times I\beta_t$ of two systems at each clock time in parallel and stores them in itself. Note that, as described above, the operator "#" in the formula (31) indicates a so-called log-sum operation of the log likelihood of transition from state m' to state m for input "0" and also the log likelihood of transition from state m" to state m for input "1". More specifically, the I$\beta$ computation/storage circuit 27 computationally determines the log likelihood $C_I \times I\beta_t$ at each clock time t by performing an arithmetic operation of formula (32) below. In other words, the I$\beta$ computation/storage circuit 27 computationally determines the log likelihood $C_I \times I\beta_t$ whose amplitude is regulated by performing an arithmetic operation of formula (30) below on the basis of the log likelihood $C_I \times I\gamma$ at each clock time t, wherein the log likelihood $C_I \times I\beta_t$ is a logarithmic expression of the probability $\beta$ of transition from the state at the coding end time to each state on an inverted time series bases for each received value $y_t$. Then, the I$\beta$ computation/storage circuit 27 supplies the soft-output computation circuit 28 with the log likelihood $C_I \times I\beta_t$ of one of the two systems it stores. At this time, it supplies the log likelihood $C_I \times I\beta_t$ in an order suitable for the processing operation of the soft-output computation circuit 28. In the following description, the log likelihood $C_I \times I\beta_t$ supplied from the I$\beta$ computation/storage circuit 27 to the soft-output computation circuit 28 is expressed by $C_I \times I\beta(\lambda)$.

$$C_I \times I\beta_t(m) = C_I \times ((I\beta_{t+1}(m') + I\gamma_{t+1}(m'))\# \quad (31)$$
$$(I\beta_{t+1}(m'') + I\gamma_{t+1}(m, m'')))$$

$$C_I \times I\beta_t(m) = C_I \times (\max(I\beta_{t+1}(m') + \quad (32)$$
$$I\gamma_{t+1}(m, m'), I\beta_{t+1}(m'') + I\gamma_{t+1}(m, m'')) +$$
$$\log(1 + e^{-|(I\beta_{t+1}(m') + I\gamma_{t+1}(m,m')) - (I\beta_{t+1}(m'') + I\gamma_{t+1}(m,m''))|}))$$

The soft-output computation circuit 28 performs an arithmetic operation of formula (33), using the log likelihoods $C_I \times I\gamma(\lambda)$ fed from the I$\gamma$ computation/storage circuit 25, the log likelihood $C_I \times I\alpha(\lambda)$ fed from the I$\alpha$ computation/storage circuit 26 and the log likelihood $C_I \times I\beta(\lambda)$ fed from the I$\beta$ computation/storage circuit 27 to determine the log likelihoods $C_I \times I\lambda_t$ at each clock time, whose amplitude is regulated, and stores it in itself. At this time, if necessary, the soft-output computation circuit 28 also computationally determines the log soft-output $C_I \times I\lambda_{It}$ corresponding to the a posteriori probability information for information bits and the log soft-output $C_I \times I\lambda_{Ct}$ corresponding to the a posteriori probability information for code bits and stores them in itself. Then, after rearranging the log soft-outputs $C_I \times I\lambda_{It}$ and/or the log soft-output $C_I \times I\lambda_{Ct}$ on a time series basis, the soft-output computation circuit 28 supplies them to the external information computation circuit 29 or externally output them. Note that the operator "#$\Sigma$" in formula (33) below indicates an cumulative addition for log-sum operations expressed by "#" as described above.

$$C_I \times I\lambda_t = C_I \times \left( \# \sum_{\substack{m',m \\ i(m',m)=1}} (I\alpha_{t-1}(m') + I\gamma_t(m', m) + I\beta_t(m)) - \right. \quad (33)$$
$$\left. \# \sum_{\substack{m',m \\ i(m',m)=0}} (I\alpha_{t-1}(m') + I\gamma_t(m', m) + I\beta_t(m)) \right)$$

The external information computation circuit 29 computationally determines the external information $1/C_A \times EX_t$, using log soft-output $C_I \times I\lambda_t$ fed from the soft-output computation circuit 28, the probability information $1/C_A \times APP_t$ fed from the multiplier 22, the second additive coefficient $C_A$ and the third additive coefficient $C_I$. At this time, if necessary, the external information computation circuit 29 also computationally determines the external information $1/C_A \times EX_{It}$ for information bits and the external information $1/C_A \times EX_{Ct}$ for code bits.

Figure 18:
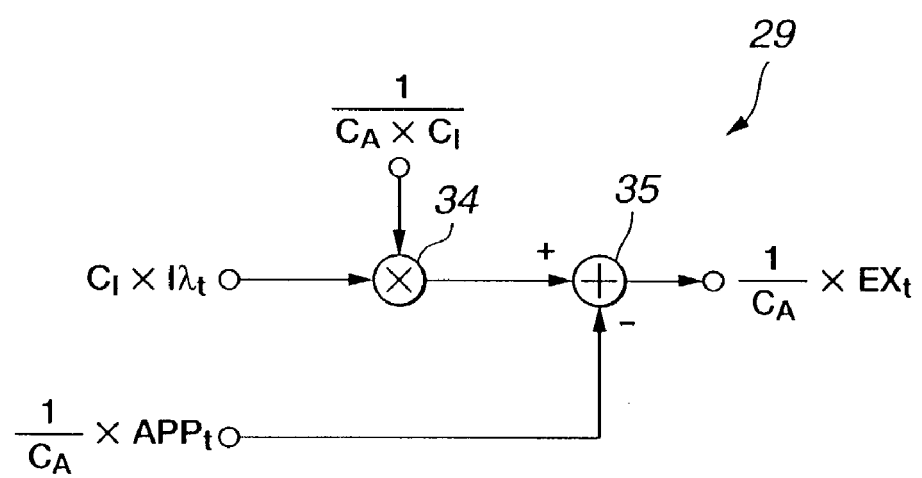
FIG. 18 is a schematic block diagram of the external information computation circuit of the decoder of FIG. 16, illustrating its substantive configuration.

More specifically, as shown in FIG. 18, the external information computation circuit 29 comprises an adder 34 that operates as three multiplying means and a differentiator 35 operating as differentiating means.

The external information computation circuit 29 multiplies the log soft-output $C_I \times I\lambda_t$ fed from the soft-output computation circuit 28 by the reciprocal of the product of multiplication of the second additive coefficient $C_A$ and the third additive coefficient $C_I$, or $1/(C_A \times C_I)$, by means of the multiplier 34 and supplies the obtained product to the differentiator 35. Then, the external information computation circuit 29 computes the difference of the information $1/C_A \times I\lambda_t$ fed from the multiplier 34 and the probability information $1/C_A \times APP_t$ fed from the multiplier 22 by means of the differentiator 35 and externally outputs the difference as external information $1/C_A \times EX_t$ obtained by regulating the amplitude of the external information $EX_t$. Although not shown, the external information computation circuit 29 in reality comprises a differentiator 35, the number of which corresponds to the number of bits of the external information $1/C_A \times EX_{I_t}$ relative to information bits, and two differentiators 35, the number of which corresponds to the number of bits of the external information $1/C_A \times EX_{C_t}$ for code bits.

In response to the input of the received value $y_t$ of the soft-input received by the receiver, the decoder 3' computes the log likelihood $C_I \times I\gamma_t$ (m', m) by means of the $I\gamma$ computation/storage circuit 25 of the soft-output decoding circuit 23 each time it receives the received value $y_t$ and also the log likelihood $C_I \times I\alpha_t$ (m) by means of the $I\alpha$ computation/storage circuit 26 each time it receives the received value $y_t$. Subsequently, upon receiving all the received values $y_t$, it computes the log likelihood $C_I \times I\beta_t$ (m) for each state m at all clock times t. Then, the decoder 3' computes the log soft-output $C_I \times I\lambda_t$ at each clock time t by means of the soft-output computation circuit 28, using the obtained log likelihoods $C_I \times I\alpha_t$, $C_I \times I\beta_t$ and $C_I \times I\gamma_t$ and externally outputs the log soft-output $C_I \times I\lambda_t$ or supplies it to the external information circuit 29. Additionally, the decoder 3' computes the external information $1/C_A \times EX_t$ at each clock time t by means of the external information computation circuit 29. In this way, the decoder 3' can perform a soft-output decoding operation by applying the Log-BCJR algorithm.

Particularly, the decoder 3' can regulate the amplitude of the channel value $AMP \times y_{tj}$ and that of the a priori probability information $APP_t$ input to the soft-output decoding circuit 23 by defining the first additive coefficient $C_R$, the second additive coefficient $C_A$ and the third additive coefficient $C_I$ so that it can optimally define an dynamic range and a quantization slot to be used for the inputs to the soft-output circuit 23 along with a quantization slot necessary for internal arithmetic operations of the soft-output decoding circuit 23 that are to be conducted to generate the log soft-output $I\lambda_t$ and/or the external information $EX_t$.

As an example, assume an input of channel value $AMP \times y_{tj}$ expressed with a gradation between −255 and +255 when the number of bits that can be entered to the soft-output decoding circuit 23 as input is not greater than seven bits and hence it is only possible to input with a gradation between −127 and +127.

Then, the decoder 3' selects "2" for both the first additive coefficient $C_R$ and the second additive coefficient $C_A$ and, at the same time, selects "½" for the third additive coefficient $C_I$. In other words, the decoder 3' halves the channel value $AMP \times y_{tj}$ and the a priori probability information $APP_t$ input to the soft-output decoding circuit 23. Thus, the decoder 3' can express the channel value $AMP \times y_{tj}$ and the a priori probability information $APP_t$ input to the soft output decoding circuit 23 with a gradation between −127 and +127 so that it can inputs the channel value $AMP \times y_{tj}$ and the a priori probability information $APP_t$ to the soft-output decoding circuit 23 without inadvertently clipping them.

In this way, the decoder 3' can optimally define a dynamic range and a quantization slot for the channel value $AMP \times y_{tj}$ and the a priori probability information $APP_t$ to be input to the soft-output decoding circuit 23 that requires its inputs to be made with a fixed number of bits as a function of the coefficient AMP by which the received value $y_{tj}$ is multiplied by selecting the first additive coefficient $C_R$, the second additive coefficient $C_A$ and the third additive coefficient $C_I$. Thus, it can optimally define the quantization slot necessary for the internal arithmetic operations in the soft-output decoding circuit 23.

At this time, the decoder 3' can operate for multiplications by means of bit shifts without actually using the above described multipliers 22, 31, 32, 34 by selecting values that can be expressed by power exponents of 2 respectively for the first additive coefficient $C_R$, the second additive coefficient $C_A$ and the third additive coefficient $C_I$ to realize high speed processing operations and a reduced circuit size.

Note that predetermined constant values may be selected respectively for the first additive coefficient $C_R$, the second additive coefficient $C_A$ and the third additive coefficient $C_I$. Particularly, when the Log-BCJR algorithm is applied, the regulating operation for computing the correction term necessary when computing log-sums for determining the log likelihoods $I\alpha_t$, $I\beta_t$, or the second term of the right side of each of the above formulas (30) and (32), can be eliminated by using a predetermined constant value for the third additive coefficient $C_I$.

It is possible to make the quantization slot of information for internal arithmetic operations finer relative to the quantization slot of information outside the soft-output decoding circuit 23 by selecting a value greater than "1" for the third additive coefficient $C_I$. With such an arrangement, it is possible to improve the performance of the decoder 3' as evidenced by simulations.

The decoder 3' may be made to comprise only the soft-output decoding circuit 23. If such is the case, the above described multipliers 21, 22 are arranged in another decoder arranged upstream. Also, the decoder 3' may be made to externally output not the log soft-output $C_I \times I\lambda_t$ but the log soft-output $I\lambda_t$ obtained by multiplying the log soft-output $C_I \times I\lambda_t$ by the reciprocal of the third additive coefficient $C_I$. Then, the operation of multiplying the log soft-output $C_I \times I\lambda_t$ by the reciprocal of the third additive coefficient $C_I$ may be conducted in the inside of the soft-output decoding circuit 23 or at the outside thereof. Furthermore, if the decoder 3' is not applied to iterative decoding as will be described hereinafter, it does not need to be provided with the external information computation circuit 29 nor compute the log soft-output $C_I \times I\lambda_{C_t}$ that corresponds to the a priori probability information for code bits.

Now, a decoder 3 adapted to iterative decoding will be described. Then, the decoder 3 is realized by applying the above described decoder 3'.

Figure 19:
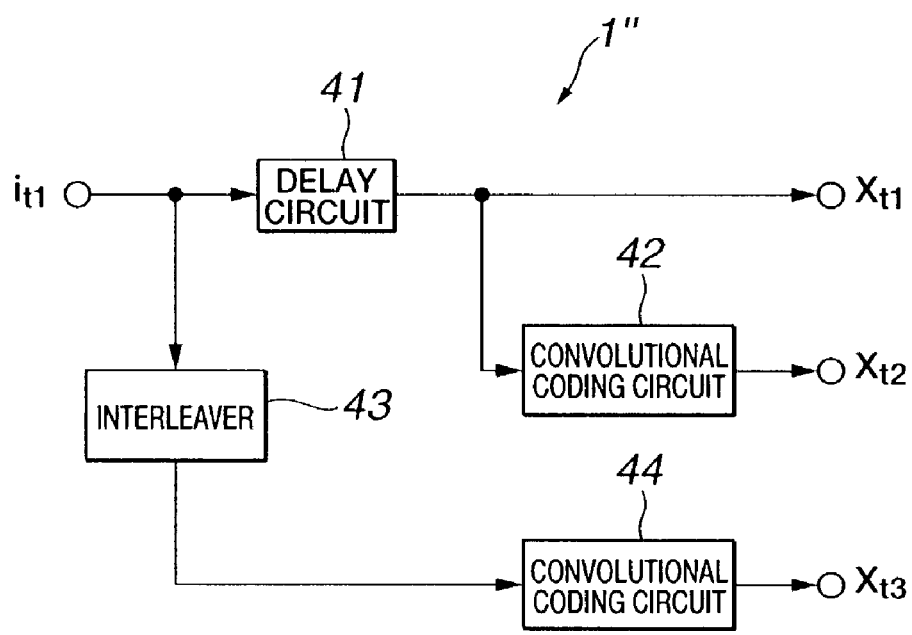
FIG. 19 is a schematic block diagram of an encoder adapted to encode PCCCs, illustrating its configuration.
Figure 20:
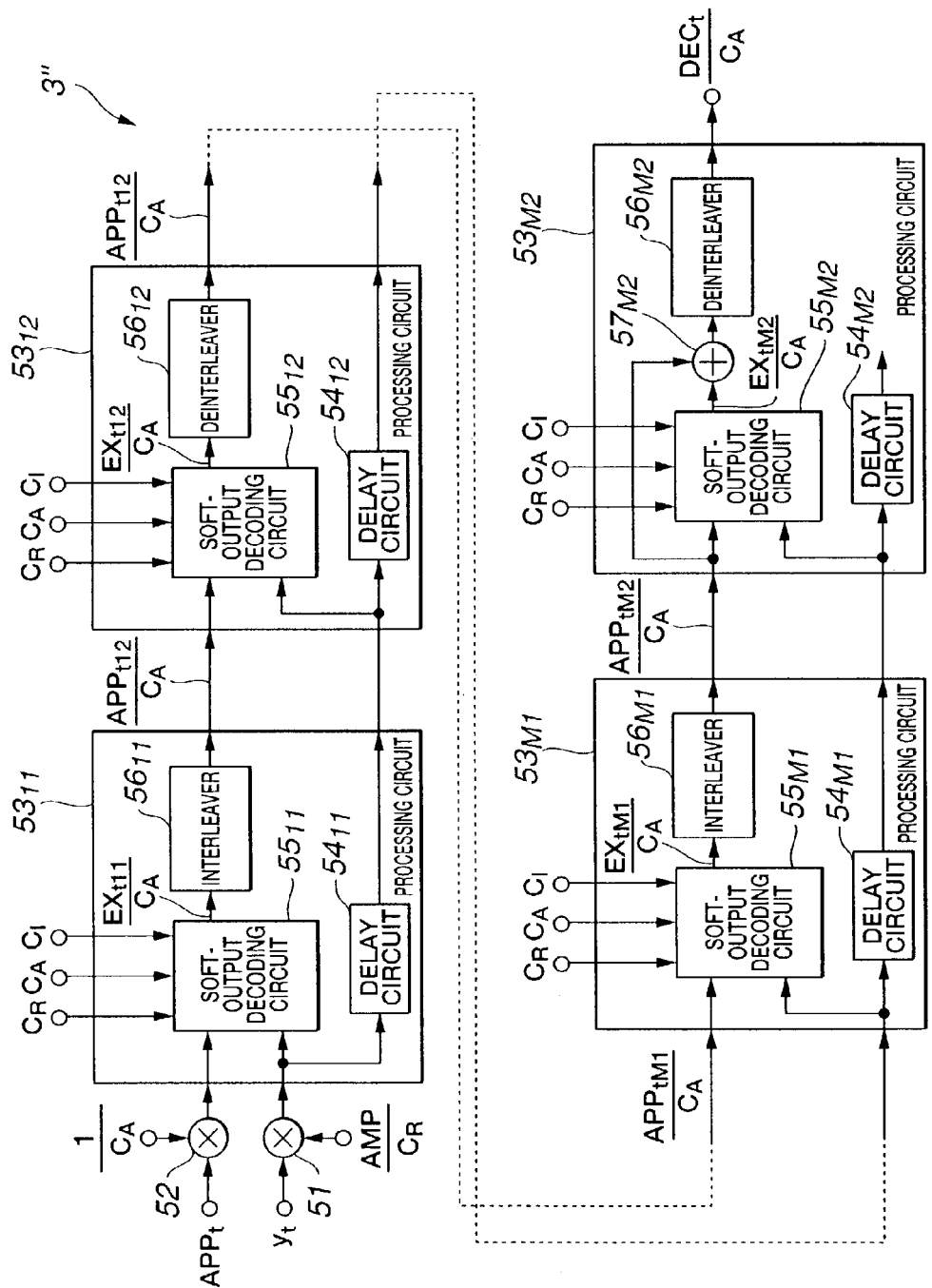
FIG. 20 is a schematic block diagram of a decoder adapted to decode the codes encoded by the encoder of FIG. 19, illustrating its configuration.
Figure 21:
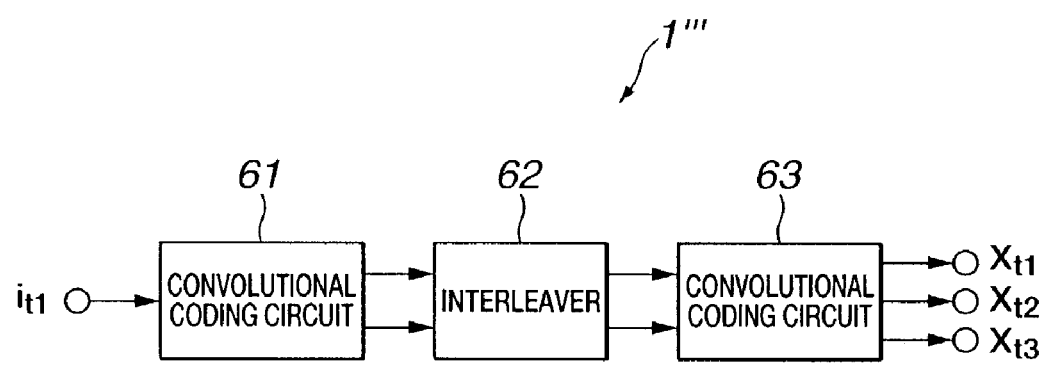
FIG. 21 is a schematic block diagram of an encoder adapted to encode SCCCs, illustrating its configuration.
Figure 22:
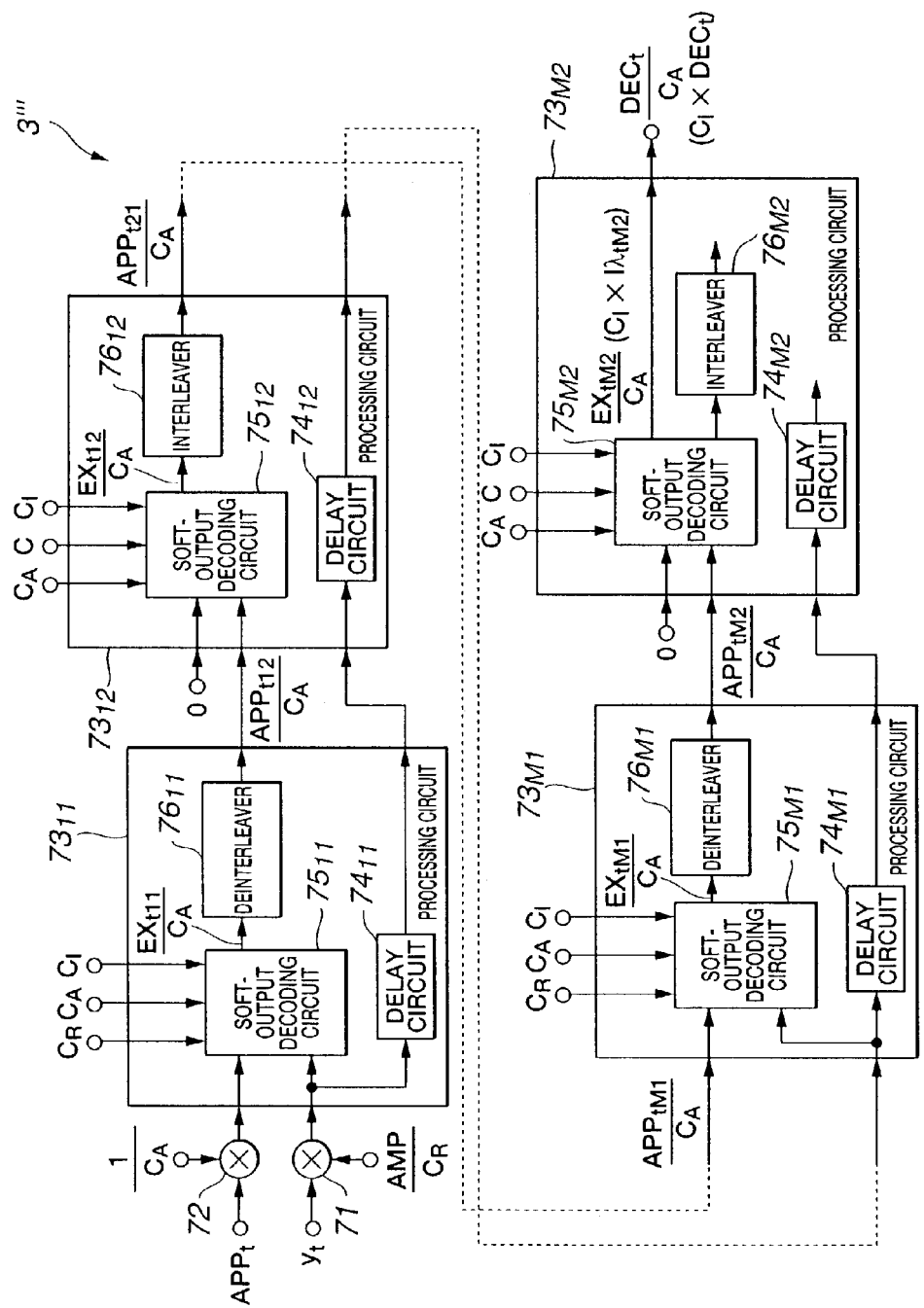
FIG. 22 is a schematic block diagram of a decoder adapted to decode the codes encoded by the encoder of FIG. 21, illustrating its configuration.

As discussed above, it is possible to make the encoder 1 adapted to modulate not only convolutional codes but also PCCCs and SCCCs by means of a modulation method such as the BPSK modulation method, the QPSK modulation method, the TTCM method or the SCTCM method. If such is the case, the decoder 3 is so configured that it performs an iterative decoding operation by concatenating a plurality of soft-output decoding circuits adapted to do MAP decoding on the basis of any of the above described algorithms by way of an interleaver or deinterleaver. Here, an encoder 1'' and a decoder 3" adapted to respectively perform coding and decoding operations by means of PCCCs as shown in FIGS. 19 and 20 and an encoder 1''' and a decoder 3''' adapted to respectively perform coding and decoding operations by means of SCCCs as shown in FIGS. 21 and 22 will be described.

Firstly, an encoder 1" adapted to perform coding operations by means of PCCCs and a decoder 3" adapted to decode the codes encoded by the encoder 1" will be discussed.

The encoder 1" may comprise a delay circuit 41 for delaying the input data, two convolutional coding circuits 42, 44 for convolutional coding operations and an interleaver 43 for rearranging the sequence of data. The encoder 1" performs a parallel concatenated convolutional coding operation with a coding ratio of "1/3" on a 1-bit input data $i_{t1}$, generates 3-bit output data $x_{t1}$, $x_{t2}$ and $x_{t3}$ and outputs the data to the outside by way of a modulator (not shown) adapted to use e.g., a BPSK modulation method or a QPSK modulation method.

The delay circuit 41 is provided to make the timings of outputting the 3-bit output data $x_{t1}$, $x_{t2}$ and $x_{t3}$ match each other. Upon receiving a 1-bit input data $i_{t1}$, the delay circuit 41 delays the input data $i_{t1}$ by a time period equal to the time required for the processing operation of the interleaver 43. The delay circuit 41 externally outputs the delayed data obtained as a result of the delay as 1-bit output data $x_{t1}$ out of 3-bit output data $X_t$ and also supplies it to the downstream convolutional coding circuit 42.

Upon receiving the delayed 1-bit data from the delay circuit 41, the convolutional coding circuit 42 performs a convolutional coding operation on the delayed data and externally outputs the outcome of the operation as 1-bit output data $x_{t2}$ out of the 3-bit output data $X_t$.

The interleaver 43 receives the input data $i_{t1}$ of a series of bits, rearrange the order of arrangement of the bits of the input data $i_{t1}$ and supplies the generated interleave data to the downstream convolutional coding circuit 44.

Upon receiving the 1-bit interleave data supplied from the interleaver 43, the convolutional coding circuit 44 performs a convolutional coding operation on the interleave data and externally outputs the outcome of the operation as 1-bit output data $x_{t3}$ of the 3-bit output data $X_t$.

Thus, upon receiving a 1-bit input data $i_{t1}$, the encoder 1" as a whole performs a parallel concatenated convolutional coding operation with a coding ratio of "1/3" by outputting the input data $i_{t1}$ as systematic component output data $x_{t1}$ by way of the delay circuit 41 and also by externally outputting the output data $x_{t2}$ obtained as a result of the convolutional coding operation conducted on the delayed data by means of the convolutional coding circuit 42 and the output data $x_{t3}$ obtained as a result of the convolutional coding operation conducted on the interleave data by means of the convolutional coding circuit 44. The data encoded by the encoder 1" are mapped for the signal points by a modulator (not shown) on the basis of a predetermined modulation method and output to the receiver by way of the memoryless communication channel 2.

On the other hand, as shown in FIG. 20, the decoder 3" for decoding the code encoded by the encoder 1" comprises two multipliers 51, 52 and 2×M processing circuits $53_{11}$, $53_{12}$, ..., $53_{M1}$, $53_{M2}$, which perform decoding operations corresponding to the coding operations of the convolutional coding circuits 42, 44 that are element coding circuits of the encoder 1", the number of the processing circuits being equal to the product of multiplication of the number of element codes and the number of times M of repetition of iterative decoding operation. The decoder 3" is adapted to estimate the input data $i_{t1}$ by obtaining decoded data $DEC_t$ from the received value $y_t$ that is reduced as soft-input under the influence of the noise generated on the memoryless communication channel 2 by means of an iterative decoding operation.

Like the multiplier 21 of the above described decoder 3', the multiplier 51 multiplies the received value $y_t$ by $AMP/C_R$, which is obtained by dividing the coefficient AMP by the first additive coefficient $C_R$. Then, the multiplier 51 supplies the obtained probability information $AMP/C_R \times y_t$ that is the product of multiplication to the processing circuit $53_{11}$.

Then, like the multiplier 22 of the decoder 3', the multiplier 52 multiplies the a priori probability information $APP_t$ by the reciprocal $1/C_A$ of the second additive coefficient $C_A$. Thereafter, the multiplier 52 supplies the obtained probability information $1/C_A \times APP_t$ to the processing circuit $53_{11}$.

The processing circuits $53_{11}$, $53_{12}$, ..., $53_{M1}$, $53_{M2}$ are substantially identical LSIs and each of them is formed by arranging integrally all the components on a single semiconductor substrate. Of the processing circuits $53_{11}$, $53_{12}$, ..., $53_{M1}$, $53_{M2}$, those expressed by $53_{i1}$ are provided in correspondence to the convolutional coding circuit 42 of the encoder 1" and adapted to iteratively perform the i-th decoding operation, whereas those expressed by $53_{i2}$ are provided in correspondence to the convolutional coding circuit 44 of the encoder 1" and adapted to iteratively perform the i-th decoding operation.

More specifically, the processing circuit $53_{11}$ comprises a delay circuit $54_{11}$ that is a delay means for delaying the input data, a soft-output decoding circuit $55_{11}$ and an interleaver $56_{11}$ that is an interleaving means for rearranging the order of arrangement of the input data.

The delay circuit $54_{11}$ is provided to make the timing of outputting the probability information $1/C_A \times APP_{t12}$ supplied from the interleaver $56_{11}$ match that of inputting the probability information $AMP/C_R \times y_t$ to the next step processing circuit $53_{12}$. Upon receiving the probability information $AMP/C_R \times y_t$ supplied from the multiplier 51, the delay circuit $54_{11}$ delays the probability information $AMP/C_R \times y_t$ by the time period equal to the time period required for the processing operation of the soft-output circuit $55_{11}$ and the interleaves $56_{11}$. Then, the delay circuit $54_{11}$ supplies the delayed probability information $AMP/C_R \times y_t$ to the next step processing circuit $53_{12}$.

The soft-output decoding circuit $55_{11}$ is provided in correspondence to the convolutional coding circuit 42 of the encoder 1" and, although not shown, has a configuration similar to that of the soft-output decoding circuit 23 of the above described decoder 3'. Like the soft-output decoding circuit 23, the soft-output decoding circuit $55_{11}$ performs a soft-output decoding operation, using the probability information $AMP/C_R \times y_t$ fed from the multiplier 51, the probability information $1/C_A \times APP_t$ fed from the multiplier 52, the first additive coefficient $C_R$, the second additive coefficient $C_A$ and the third additive coefficient $C_I$. The soft-output decoding circuit $55_{11}$ computationally determines the external information $1/C_A \times EX_{t11}$, for information bits required by the constraining condition of code and supplies the external information $1/C_A \times EX_{t11}$ to the downstream interleaver $56_{11}$ as soft-output. However, note that, unlike the above described soft-output decoding circuit 23, the soft-output decoding circuit $55_{11}$ does not need to output a log soft-output for information bits nor computationally determine the log soft-output and external information for code bits.

The interleaver $56_{11}$ inverleaves the external information $1/C_A \times EX_{t11}$ for information bits, which is the soft-input from the soft-output decoding circuit $55_{11}$, on the basis of the information on the position of substitution that is identical with the corresponding information of the interleaver 43. The interleaver $56_{11}$ supplies the external information obtained as a result of the interleaving operation to the processing circuit $53_{12}$ of the next step as probability information $1/C_A \times APP_{t12}$ that is obtained by regulating the amplitude of the a priori probability information for information bits for the next step processing circuit $53_{12}$.

The processing circuit $53_{12}$ comprises a delay circuit $54_{12}$ that is a delay means for delaying the input data, a soft-output decoding circuit $55_{12}$ that is a soft-output decoding means for soft-output decoding and a deinterleaver $56_{12}$ that is a deinterleaving means for restoring the original order of arrangement of the input data.

The delay circuit $54_{12}$ is provided to make the timing of outputting the probability information $1/C_A \times APP_{t21}$ supplied from the deinterleaver $56_{12}$ match that of inputting the probability information $AMP/C_R \times y_t$ to the next step processing circuit $53_{21}$. Upon receiving the probability information $AMP/C_R \times y_t$ supplied from the processing circuit $53_{11}$, the delay circuit $54_{12}$ delays the probability information $AMP/C_R \times y_t$ by the time period equal to the time period required for the processing operation of the soft-output circuit $55_{12}$ and the deinterleaver $56_{12}$. Then, the delay circuit $54_{12}$ supplies the delayed probability information $AMP/C_R \times y_t$ to the next step processing circuit $53_{21}$.

The soft-output decoding circuit $55_{12}$ is provided in correspondence to the convolutional coding circuit 44 of the encoder 1" and, although not shown, has a configuration similar to that of the soft-output decoding circuit 23 of the above described decoder 3'. The soft-output decoding circuit $55_{12}$ performs a soft-output decoding operation, using the probability information $AMP/C_R \times y_t$ and $1/C_A \times APP_{t12}$ fed from the processing circuit $53_{11}$, the first additive coefficient $C_R$, the second additive coefficient $C_A$ and the third additive coefficient $C_I$. The soft-output decoding circuit $55_{12}$ computationally determines the external information $1/C_A \times EX_{t12}$ for information bits required by the constraining condition of code and supplies the external information $1/C_A \times EX_{t12}$ to the downstream deinterleaver $56_{12}$ as soft-output. However, note that, unlike the above described soft-output decoding circuit 23, the soft-output decoding circuit $55_{12}$ does not need to output a log soft-output for information bits nor computationally determine the log soft-output and external information for code bits.

The deinterleaver $56_{12}$ deinverleaves the external information $1/C_A \times EX_{t12}$ for information bits, which is the soft-output from the soft-output decoding circuit $55_{11}$, so as to restore the bit arrangement of the original input data $i_{t1}$ that has been interleaved by the interleaver 43 of the encoder 1". The deinterleaver $56_{12}$ supplies the external information obtained as a result of the deinterleaving operation to the processing circuit $53_{21}$ of the next step as probability information $1/C_A \times APP_{t12}$ that is obtained by regulating the amplitude of the a priori probability information for information bits for the next step processing circuit $53_{21}$.

Like the processing circuit $53_{11}$, the processing circuit $53_{M1}$ comprises a delay circuit $54_{M1}$ that is a delay means for delaying the input data, a soft-output decoding circuit $55_{M1}$ that is a soft-output decoding means and an interleaver $56_{M1}$ that is an interleaving means for rearranging the order of arrangement of the input data. Like the processing circuit $53_{11}$, the processing circuit $53_{M1}$ performs a soft-output decoding operation, using the probability information $AMP/C_R \times y_t$, and $1/C_A \times APP_{tM1}$ fed from the multiplier processing $53_{M-11}$, the first additive coefficient $C_R$, the second additive coefficient $C_A$ and the third additive coefficient $C_I$ and supplies the obtained external information to the processing circuit $53_{M2}$ of the final step as probability information $1/C_A \times APP_{tM2}$ that is obtained by regulating the amplitude of the a priori probability information for information bits for the next step processing circuit $53_{M2}$. Like the processing circuit $53_{12}$, the processing circuit $53_{M2}$ of the final step comprises a delay circuit $54_{M2}$ that is a delay means for delaying the input data, a soft-output decoding circuit $55_{M2}$ that is a soft-output decoding means and a deinterleaver $56_{M2}$ that is a deinterleaving means for restoring the original order of arrangement of the input data along with two adders $57_{M2}$ for adding data. The processing circuit $53_{M2}$ does not output the probability information $AMP/C_R \times y_t$ supplied from the processing circuit $53_{M1}$ and delayed by the delay circuit $54_{M2}$ nor allow the probability information $AMP/C_R \times y_t$ fed from the processing circuit $53_{M1}$ to be input to the delay circuit $54_{M2}$. The processing circuit $53_{M2}$ outputs the decoded data $1/C_A + DEC_t$ obtained by regulating the amplitude of the decoded data $DEC_t$ which is obtained by adding the external information $1/C_A \times EX_{tM2}$ that is obtained by regulating the amplitude of the a priori probability information for information bits as a result of a processing operation similar to that of the soft-output decoding circuit $55_{12}$ of the processing circuit $53_{12}$ and the probability information $1/C_A \times APP_{tM2}$ fed from the processing circuit $53_{M1}$ as a priori probability information for information bits obtained by regulating the amplitude by means of the adder $57_{M2}$ and deinterleaving the sum by means of the deinterleaver $56_{M2}$.

Thus, since the decoder 3" comprises the soft-output decoding circuits $55_{i1}$, $55_{i2}$ that correspond to the convolutional coding circuits 42, 44 of the encoder 1", it can decompose a code requiring a highly complex decoding operation into elements that are less complex to successively improve its performance through the interaction of the soft-output decoding circuits $55_{i1}$, $55_{i2}$. Upon receiving the received value $y_t$, the decoder 3" performs an iterative decoding operation for a number of times of M by means of the 2×M processing circuits $53_{11}$, $53_{12}$, ..., $53_{M1}$, $53_{M2}$ and outputs the decoded data $1/C_A + DEC_t$ obtained on the basis of the external information $1/C_A \times EX_{tM2}$ of the soft-output obtained as a result of the decoding operation. Like the decoder 3', the decoder 3" can regulate the amplitude of the channel value $AMP \times y_t$ and that of the a priori probability information $APP_t$ input to each of the processing circuits $53_{11}$, $53_{12}$, ..., $53_{M1}$, $53_{M2}$ by selecting the first additive coefficient $C_R$, the second additive coefficient $C_A$ and the third additive coefficient $C_I$ so that it can optimally select the dynamic range and the quantization slot to be used for inputting data to the processing circuits $53_{11}$, $53_{12}$, ..., $53_{M1}$, $53_{M2}$ and also the quantization slot necessary for the internal arithmetic operations of the processing circuits $53_{11}$, $53_{12}$, ..., $53_{M1}$, $53_{M2}$.

The decoder 3" may be so arranged that it externally outputs the decoded data $DEC_t$ obtained by multiplying the decoded data $1/C_A \times DEC_t$ by the second additive coefficient $C_A$ instead of outputting the decoded data $1/C_A \times DEC_t$. The multiplication of the decoded data $1/C_A \times DEC_t$ by the second additive coefficient $C_A$ may be conducted either in the inside or at the outside of the processing circuit $53_{M2}$. The processing circuits $53_{11}$, $53_{12}$, ..., $53_{M1}$, $53_{M2}$ of the decoder 3" may have a same and identical configuration. If such is the case, the processing circuits $53_{11}$, $53_{12}$, ..., $53_{M1}$ are made to comprise respective adders like the processing circuit $53_{M2}$. Then, the adders need to be controlled by a control signal so that any unnecessary adders may not be operated.

Now, an encoder 1''' adapted to perform coding operations by means of SCCCs and a decoder 3''' adapted to decode the codes encoded by the encoder 1''' will be discussed.

As shown in FIG. 21, the encoder 1''' may comprise a convolutional coding circuit 61 for coding a code referred to as outer code, an interleaver 62 for rearranging the sequence of input data and a convolutional coding circuit 63 for coding a code referred to as inner code. The encoder 1''' performs a serially concatenated convolutional coding operation with a coding ratio of "1/3" on a 1-bit input data $i_{t1}$, generates 3-bit output data $x_{t1}$, $x_{t2}$ and $x_{t3}$ and outputs the data to the outside by way of a modulator (not shown) adapted to use e.g., a BPSK modulation method or a QPSK modulation method.

Upon receiving a 1-bit input data $i_{t1}$, the convolutional coding circuit 61 performs a convolutional coding operation on the input data $i_{t1}$ and supplies the outcome of the operation as 2-bit coded data to the downstream interleaver 62. In other words, the convolutional coding circuit 61 performs a convolutional coding operation with a coding ratio of "1/2" for coding an outer code and supplies the coded data to the downstream interleaves 62.

The interleaver 62 receives the coded data of two series of bits fed from the convolutional coding circuit 61, rearrange the order of arrangement of the bits of the input data and supplies the generated interleave data of two series of bits to the downstream convolutional coding circuit 63.

Upon receiving the 2-bit interleave data fed from the interleaver 62, the convolutional coding circuit 63 performs a convolutional coding operation on the interleave data and externally outputs the outcome of the operation as output data $x_{t1}$, $x_{t2}$ and $x_{t3}$. In other words, the convolutional coding circuit 63 performs a convolutional coding operation with a coding ratio of "2/3" for coding an inner code and externally outputs output data $x_t$.

The encoder 1''' performs a convolutional coding operation of encoding an outer code by means of the convolutional coding circuit 61 with a coding ratio of "1/2" and a convolutional coding operation of encoding an inner code by means of the convolutional coding circuit 63 with a coding ratio of "2/3" so as to realize a serially concatenated convolutional coding with a coding ratio of "(1/2)×(2/3)=1/3" as a whole. Then, the data encoded by the encoder 1''' are mapped for the signal points by a modulator (not shown) on the basis of a predetermined modulation method and output to the receiver by way of the memoryless communication channel 2.

On the other hand, as shown in FIG. 22, the decoder 3''' for decoding the code encoded by the encoder 1''' comprises two multipliers 71, 72 and 2×M processing circuits $73_{11}$, $73_{12}$, ..., $73_{M1}$, $73_{M2}$, which perform decoding operations corresponding to the coding operations of the convolutional coding circuits 61, 63 that are element coding circuits of the encoder 1''', the number of the processing circuits being equal to the product of multiplication of the number of element codes and the number of times of repetition of iterative decoding operation. The decoder 3''' is adapted to estimate the input data $i_{t1}$ by obtaining decoded data $DEC_t$ from the received value $y_t$ that is reduced as soft-input under the influence of the noise generated on the memoryless communication channel 2 by means of an iterative decoding operation.

Like the multiplier 21 of the above described decoder 3', the multiplier 71 multiplies the received value $y_t$ by AMP/$C_R$, which is obtained by dividing the coefficient AMP by the first additive coefficient $C_R$. Then, the multiplier 71 supplies the obtained probability information AMP/$C_R \times y_t$ that is the product of multiplication to the processing circuit $73_{11}$.

Then, like the multiplier 22 of the decoder 3', the multiplier 72 multiplies the a priori probability information $APP_t$ by the reciprocal of the second additive coefficient $C_A$. Thereafter, the multiplier 72 supplies the obtained probability information $1/C_A \times APP_t$ to the processing circuit $73_{11}$.

The processing circuits $73_{11}$, $73_{12}$, ..., $73_{M1}$, $73_{M2}$ are substantially identical LSIs and each of them is formed by arranging integrally all the components on a single semiconductor substrate. Of the processing circuits $73_{11}$, $73_{12}$, ..., $73_{M1}$, $73_{M2}$, those expressed by $73_{i1}$ are provided in correspondence to the convolutional coding circuit 63 for inner code of the encoder 1''' and adapted to iteratively perform the i-th decoding operation, whereas those expressed by $73_{i2}$ are provided in correspondence to the convolutional coding circuit 61 for outer code of the encoder 1''' and adapted to iteratively perform the i-th decoding operation.

More specifically, the processing circuit $73_{11}$ comprises a delay circuit $74_{11}$ that is a delay means for delaying the input data, a soft-output decoding circuit $75_{11}$ that is a soft-output decoding means and an deinterleaver $76_{11}$ that is a deinterleaving means for restoring the original order of arrangement of the input data.

The delay circuit $74_{11}$ is provided to make the timing of outputting the probability information $1/C_A \times APP_{t12}$ supplied from the deinterleaver $76_{11}$ match that of inputting the probability information AMP/$C_R \times y_t$ to the next step processing circuit $73_{12}$. Upon receiving the probability information AMP/$C_R \times y_t$ supplied from the multiplier 71, the delay circuit $74_{11}$ delays the probability information AMP/$C_R \times y_t$ by the time period equal to the time period required for the processing operation of the soft-output circuit $75_{11}$ and the deinterleaver $76_{11}$. Then, the delay circuit $74_{11}$ supplies the delayed probability information AMP/$C_R \times y_t$ to the next step processing circuit $73_{12}$.

The soft-output decoding circuit $75_{11}$ is provided in correspondence to the convolutional coding circuit 63 of the encoder 1''' and, although not shown, has a configuration similar to that of the soft-output decoding circuit 23 of the above described decoder 3'. Like the soft-output decoding circuit 23, the soft-output decoding circuit $75_{11}$ performs a soft-output decoding operation, using the probability information AMP/$C_R \times y_t$ fed from the multiplier 71, the probability information $1/C_A \times APP_t$ fed from the multiplier 72, the first additive coefficient $C_R$, the second additive coefficient $C_A$ and the third additive coefficient $C_I$. The soft-output decoding circuit $75_{11}$ computationally determines the external information $1/C_A \times EX_{t11}$ for information bits required by the constraining condition of code and supplies the external information $1/C_A \times EX_{t11}$ to the downstream deinterleaver $76_{11}$ as soft-output. The external information $1/C_A \times EX_{t11}$ corresponds to the interleave data interleaved by the interleaver 62 of the encoder 1'''. However, note that, unlike the above described soft-output decoding circuit 23, the soft-output decoding circuit $75_{11}$ does not need to output a log soft-output for information bits nor computationally determine the log soft-output and external information for code bits.

The deinterleaver $76_{11}$ deinverleaves the external information $1/C_A \times EX_{t11}$ for information bits, which is the soft-output from the soft-output decoding circuit $75_{11}$, so as to restore the original bit array of the input data $i_{t1}$ from the bit array of the data interleaved by the interleaver 62 of the encoder 1'''. Then, the deinterleaver 76₁₁ supplies the external information obtained as a result of the deinterleaving operation to the processing circuit 73₁₂ of the next step as probability information $1/C_A \times APP_{t12}$ that is obtained by regulating the amplitude of the a priori probability information for information bits for the next step processing circuit 73₁₂.

The processing circuit 73₁₂ comprises a delay circuit 74₁₂ that is a delay means for delaying the input data, a soft-output decoding circuit 75₁₂ and an interleaver 76₁₂ that is an interleaving means for rearranging the order of arrangement of the input data.

The delay circuit 74₁₂ is provided to make the timing of outputting the probability information $1/C_A \times APP_{t21}$ supplied from the interleaver 76₁₂ match that of inputting the probability information $AMP/C_R \times y_t$ to the next step processing circuit 73₂₁. Upon receiving the probability information $AMP/C_R \times y_t$ supplied from the processing circuit 73₁₁, the delay circuit 74₁₂ delays the probability information $AMP/C_R \times y_t$ by the time period equal to the time period required for the processing operation of the soft-output circuit 75₁₂ and the interleaver 76₁₂. Then, the delay circuit 74₁₂ supplies the delayed probability information $AMP/C_R \times y_t$ to the next step processing circuit 73₂₁.

The soft-output decoding circuit 75₁₂ is provided in correspondence to the convolutional coding circuit 61 of the encoder 1''' and, although not shown, has a configuration similar to that of the soft-output decoding circuit 23 of the above described decoder 3'. Like the soft-output decoding circuit 23, the soft-output decoding circuit 75₁₂ performs a soft-output decoding operation on the external code, using the probability information $AMP/C_R \times y_t$ fed from the processing circuit 73₁₁, the a priori probability information for information bits having a value of "0", an arbitrary coefficient C, the second additive coefficient $C_A$ and the third additive coefficient $C_I$. Note that a coefficient identical with the second coefficient $C_A$ applied to the soft-output decoding circuit 75₁₁ is input to the terminal of the soft-output decoding circuit 75₁₂ that is supposed to receive the first coefficient $C_R$ and the coefficient C having an arbitrarily selected value is applied to the terminal that is supposed to receive the second coefficient $C_A$. The coefficient C having an arbitrarily selected value is input to the terminal that is supposed to receive the second coefficient $C_A$ because the value of the a priori probability information for information bits that is multiplied by the coefficient C is equal to "0". The soft-output decoding circuit 75₁₂ computationally determines the external information $1/C_A \times EX_{t12}$ for code bits required by the constraining condition of code and supplies the external information $1/C_A \times EX_{t12}$ to the downstream interleaver 76₁₂ as soft-output. However, note that, unlike the above described soft-output decoding circuit 23, the soft-output decoding circuit 75₁₂ does not need to output a log soft-output for information bits nor computationally determine the log soft-output and external information for code bits.

The interleaver 76₁₂ inverleaves the external information $1/C_A \times EX_{t12}$ for code bits, which is the soft-output from the soft-output decoding circuit 75₁₂, on the basis of the information on the position of substitution that is identical with the corresponding information of the interleaver 62 of the encoder 1'''. The interleaver 76₁₂ supplies the external information obtained as a result of the interleaving operation to the processing circuit 73₂₁ of the next step as probability information $1/C_A \times APP_{t21}$ that is obtained by regulating the amplitude of the a priori probability information for information bits for the next step processing circuit 73₂₁ (not shown).

Like the processing circuit 73₁₁, the processing circuit 73_{M1} comprises a delay circuit 74_{M1} that is a delay means for delaying the input data, a soft-output decoding circuit 75_{M1} that is a soft-output decoding means and a deinterleaver 76_{M1} that is a deinterleaving means for restoring the original order of arrangement of the input data. Like the processing circuit 73₁₁, the processing circuit 73_{M1} performs a processing operation, using the probability information $AMP/C_R \times y_t$, and $1/C_A \times APP_{tM1}$ fed from the processing circuit 73_{M-11} (not shown), the first additive coefficient $C_R$, the second additive coefficient $C_A$ and the third additive coefficient $C_I$ and supplies the obtained external information to the processing circuit 73_{M2} of the final step as probability information $1/C_A \times APP_{tM2}$ that is obtained by regulating the amplitude of the a priori probability information for code bits for the next step processing circuit 73_{M2}. Note that the processing circuit 73_{M1} does not output the probability information $AMP/C_R \times y_t$ supplied from the processing circuit 73_{M-11} (not shown) and delayed by the delay circuit 74_{M1} nor allow the probability information $AMP/C_R \times y_t$ fed from the processing circuit 73_{M-11} to be input to the delay circuit 74_{M1}.

Like the processing circuit 73₁₂, the processing circuit 73_{M2} of the final step comprises a delay circuit 74_{M2} that is a delay means for delaying the input data, a soft-output decoding circuit 75_{M2} that is a soft-output decoding means and an interleaver 76_{M2} that is an interleaving means for rearranging the order of arrangement of the input data. The processing circuit 73_{M2} does not output the probability information $AMP/C_R \times y_t$ supplied from the processing circuit 73_{M1} and delayed by the delay circuit 74_{M2} nor allow the probability information $AMP/C_R \times y_t$ fed from the processing circuit 73_{M1} to be input to the delay circuit 74_{M2}. Unlike the soft-output decoding circuit 75₁₂ of the processing circuit 73₁₂, the processing circuit 73_{M2} does not need to computationally determine nor outputs the external information for code bits. Note that a coefficient identical with the second coefficient $C_A$ applied to the soft-output decoding circuit 75_{M1} is input to the terminal of the soft-output decoding circuit 75_{M2} that is supposed to receive the first coefficient $C_R$ and the coefficient C having an arbitrarily selected value is applied to the terminal that is supposed to receive the second coefficient $C_A$. The coefficient C having an arbitrarily selected value is input to the terminal that is supposed to receive the second coefficient $C_A$ because the value of the a priori probability information for information bits that is multiplied by the coefficient C is equal to "0". The processing circuit 73_{M2} computationally determines the external information $1/C_A \times EX_{tM2}$ by regulating the amplitude of the external information $EX_{tM2}$ for information bits and supplies the external information $1/C_A \times EX_{tM2}$ to the outside decoded data $1/C_A \times DEC_t$ obtained by regulating the amplitude of the decoded data $DEC_t$.

Thus, like the above described decoder 3'', since the decoder 3''' comprises the soft-output decoding circuits 75_{i1}, 75_{i2} that correspond to the convolutional coding circuits 63, 61 of the encoder 1''', it can decompose a code requiring a highly complex decoding operation into elements that are less complex to successively improve its performance through the interaction of the soft-output decoding circuits 75_{i1}, 75_{i2}. Upon receiving the received value $y_t$, the decoder 3''' performs an iterative decoding operation for a number of times of M by means of the 2×M processing circuits 73₁₁, 73₁₂, . . . , 73_{M1}, 73_{M2} and outputs the decoded data $1/C_A+DEC_t$ obtained on the basis of the external information $1/C_A+EX_{tM2}$ of the soft-output obtained as a result of the decoding operation. Like the decoders 3', 3", the decoder 3''' can regulate the amplitude of the channel value AMP×$y_t$ and that of the a priori probability information APP$_t$ input to each of the processing circuits $73_{11}$, $73_{12}$, . . . , $73_{M1}$, $73_{M2}$ by selecting the first additive coefficient $C_R$, the second additive coefficient $C_A$ and the third additive coefficient $C_I$ so that it can optimally select the dynamic range and the quantization slot to be used for inputting data to the processing circuits $73_{11}$, $73_{12}$, . . . , $73_{M1}$, $73_{M2}$ and also the quantization slot necessary for the internal arithmetic operations of the processing circuits $73_{11}$, $73_{12}$, . . . , $73_{M1}$, $73_{M2}$.

The decoder 3' may be so arranged that it externally outputs the decoded data DEC$_t$ obtained by multiplying the decoded data $1/C_A \times DEC_t$ by the second additive coefficient $C_A$ instead of outputting the decoded data $1/C_A \times DEC_t$. The multiplication of the decoded data $1/C_A \times DEC_t$ by the second additive coefficient $C_A$ may be conducted either in the inside or at the outside of the processing circuit $53_{M2}$. Since the external information EX$_{tM2}$ for information bits is identical with the log soft-output $I\lambda_{tM2}$ for information bits, the decoder 3''', may be so arranged as to output the log soft-output $C_I \times I\lambda_{tM2}$ as decoded data $C_I \times DEC_t$ instead of outputting the external information $1/C_A \times EX_{tM2}$ as decoded data $1/C_A \times DEC_t$.

Additionally, a decoder for decoding codes by means of the TTCM method may be made to have a configuration similar to that of the above described decoder 3" so that symbols of common components and those of orthogonal components may be input directly as received value $y_t$. Still additionally, a decoder for decoding codes by means of the SCTCM method may be made to have a configuration similar to that of the above described decoder 3''' so that symbols of common components and those of orthogonal components may be input directly as received value $y_t$.

Now, methods for selecting specific values for the first additive coefficient $C_R$, the second additive coefficient $C_A$ and the third additive coefficient $C_I$ will be discussed below.

Firstly, a method for selecting a value for the first additive coefficient $C_R$ will be described when the encoder 1 is adapted to do modulations, using a modulation method of arranging the signal points so as to provide a distribution of the received value for each bit such as the BPSK modulation method of the QPSK modulation method.

The coding loss that arises in a decoding operation was determined by simulation by varying the received value of each of different types of code and the dynamic range of the channel value as expressed by the product of the received value and the coefficient AMP. A sufficiently large value of "32" was selected for the dynamic range of the external information to be generated in the simulation. For codes, PCCCs with coding ratios of "1/6" and "1/3" recommended as turbo codes by the CCSDS (Consultative Committee for Space Data Systems), PCCCs with a coding ratio of "3/4" generated by puncturing on the basis of turbo codes recommended by the CCSDS, and SCCCs with a coding ratio of "1/3" were used and modulated by the BPSK modulation method. As a result of the simulation, it was confirmed that the dynamic range where no coding loss arises varies depending on the used codes in terms of both received value and channel value. Additionally, it was also confirmed that the dynamic range where no coding loss arises differs between the received value and the channel value.

The value of the coefficient AMP for signal to noise power ratio (to be referred to as $E_b/N_o$ hereinafter) per bit is determined for each code. Table 1 shows the obtained values.

TABLE 1

| Coefficient AMP | | |
|---|---|---|
| code | $E_b/N_o$ (dB) | AMP |
| PCCC (1/6) | −0.5 | 0.594167 |
| PCCC (1/3) | 0.0 | 1.33333 |
| PCCC (3/4) | 2.0 | 4.75468 |
| SCCC (1/3) | 0.5 | 1.49602 |

Figure 23:
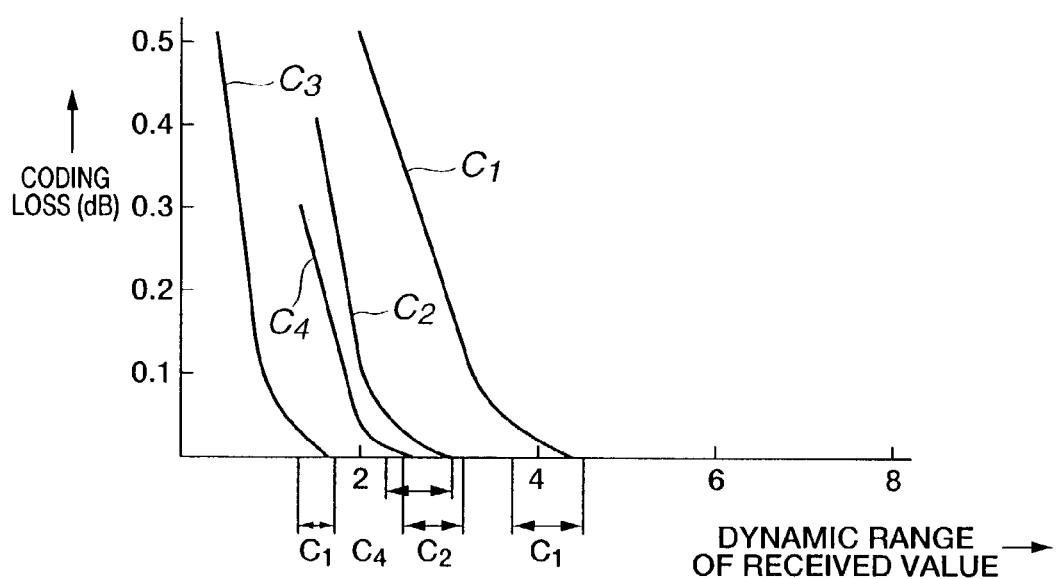
FIG. 23 is a graph illustrating the relationship between the dynamic range of received value and the coding loss.
Figure 24:
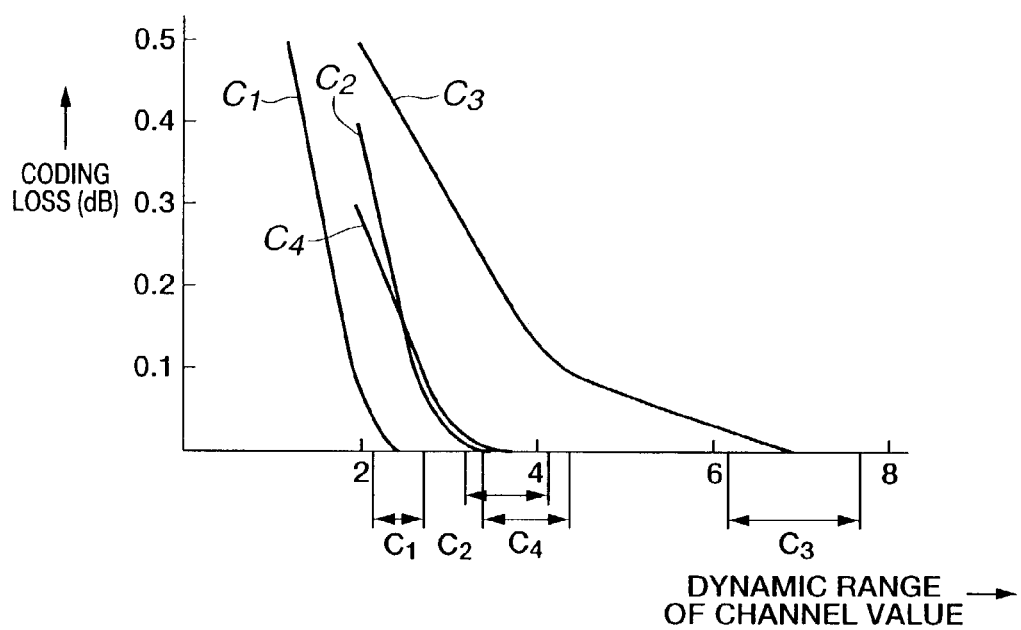
FIG. 24 is a graph illustrating the relationship between the dynamic range of channel value and the coding loss.

FIG. 23 and FIG. 24 respectively show the relationship between the dynamic range of received value and the coding loss and the relationship between the dynamic range of channel value and the coding loss. In FIGS. 23 and 24, curves $C_1$, $C_2$ and $C_3$ indicate PCCCs with coding ratios of "1/6", "1/3" and "3/4" respectively, whereas curve $C_4$ indicates SCCCs with a coding ratio of "1/3".

As seen from FIG. 23, the dynamic range of received value where the coding loss is equal to "0" is located close to "4" for PCCCs with a coding ratio of "1/6" and close to "3" for PCCCs with a coding ratio of "1/3", while the dynamic range of received value where the coding loss is equal to "0" is located close to "1.5" for PCCCs with a coding ratio of "3/4" and close to "2.5" for SCCCs with a coding ratio of "1/3".

As seen from FIG. 24, the dynamic range of channel value where the coding loss is equal to "0" is located close to "2.5" for PCCCs with a coding ratio of "1/6" and close to "3.5" for PCCCs with a coding ratio of "1/3", while the dynamic range of received value where the coding loss is equal to "0" is located close to "7" for PCCCs with a coding ratio of "3/4".

Since AWGN is added by the memoryless communication channel, both the received value and the channel value show a normal distribution and a distribution equivalent to the normal distribution can be generated by varying the variance and the average value. More specifically, as shown in FIG. 25, if the average value is "±1" and the variance is "$\sigma^2$" for the distribution of received value or channel value, the distribution can be normalized by making the average value equal to "±1/σ".

Then, optimum quantization for Viterbi decoding is applied to the post-normalization distribution obtained after normalizing the distribution of received value or channel value. With Viterbi decoding, it is known that uniform quantization using a quantization slot of "0.3" provides a good performance relative to the distribution of received value with variance of "1" when quantizing the received value to 4-bit. Then, the average value of the normalized distribution is about "2.1". It is also known that this does not depend on the type of code. The dynamic ranges indicated on the horizontal axes of FIGS. 23 and 24 are those where the average values are between "±2 to ±2.5" for the received value and the channel value respectively.

More specifically, the average of the received value is between "±2 to ±2.5" when the dynamic range of the received value is between "about 3.7 and about 4.5" for PCCCs with a coding ratio of "1/6", between "about 2.4 and about 3.1" for PCCCs with a cording ratio of "1/3", between "about 1.3 and about 1.7" for PCCCs with a coding ratio of "3/4" and between "about 2.3 and about 2.9" for SCCCs with a coding ratio of "1/3".

On the other hand, the average of the channel value is between "±2 to ±2.5" when the dynamic range of the channel value is between "about 2.2 and about 2.7" for PCCCs with a coding ratio of "1/6", between "about 3.3 and about 4.2" for PCCCs with a cording ratio of "1/3", between "about 6.2 and about 7.7" for PCCCs with a coding ratio of "3/4" and between "about 3.5 and about 4.5" for SCCCs with a coding ratio of "1/3".

From the above, it will be safe to say that the decoding accuracy is improved when the average of the received value or the channel value in the post-normalization distribution obtained after normalizing the distribution of received value or channel value is made between "±2 to ±2.5" because the coding loss is close to "0".

Figure 26:
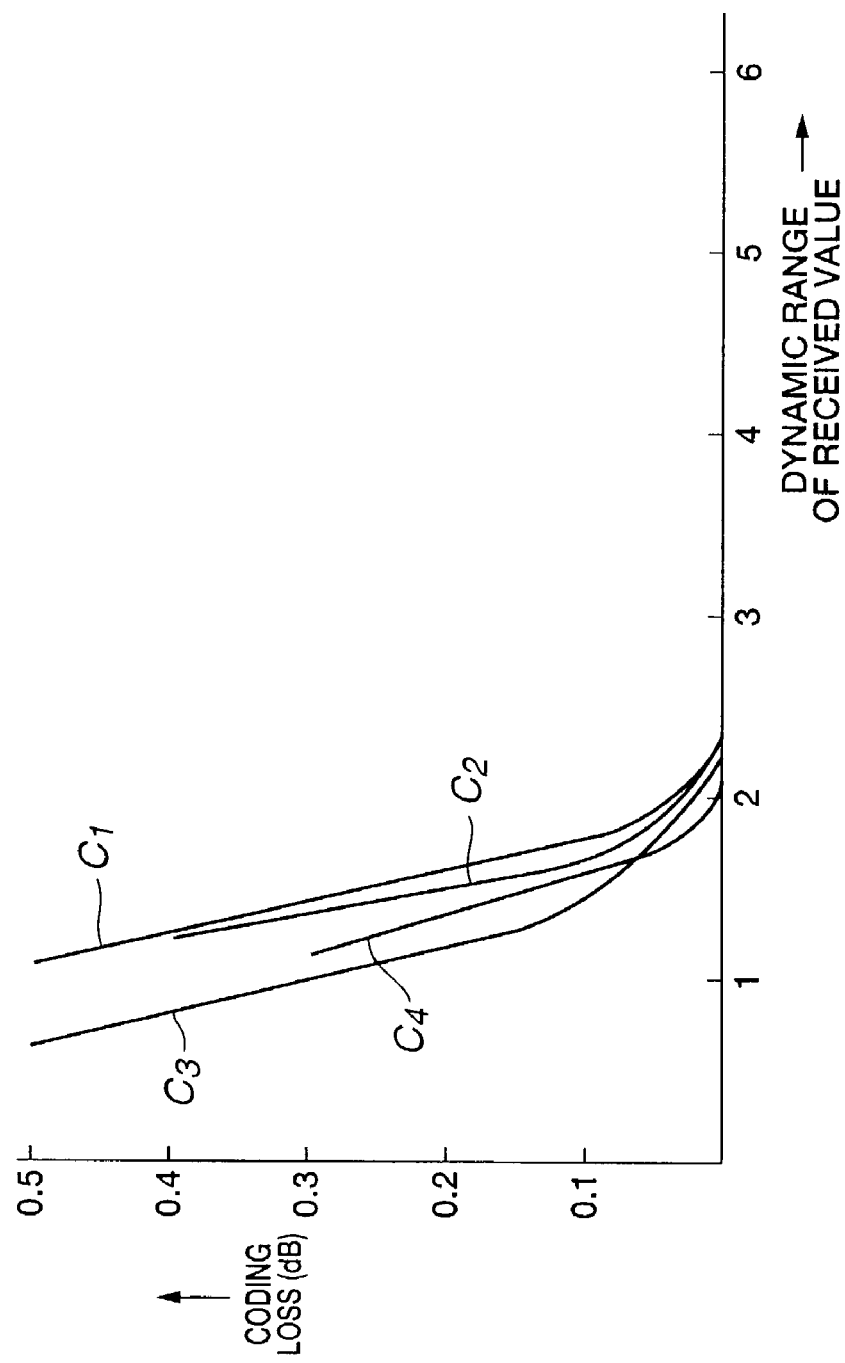
FIG. 26 is a graph illustrating the relationship between the dynamic range of received value and the coding loss after normalization of distribution.

FIG. 26 shows the relationship between the dynamic range of the received value in the post-normalization distribution obtained after normalizing the distribution of received value and the coding loss obtained as a result of a simulation conducted under the above described condition. It was confirmed that the dynamic range of the received value is found between "2 and 2.5" for any type of code when the coding loss is equal to "0".

Thus, as for the decoder 3, a value that makes the dynamic range of the probability information $AMP/C_R$ $(=(2/\sigma^2)\times(1/C_R))$ input to the LSI to be found between "±2 to ±2.5" in the post-normalization distribution obtained after normalizing the distribution of the probability information will be selected for the first additive coefficient $C_R$. In the case of the above described decoders 3', 3" and 3''', for example, a value that makes the dynamic range of the probability information $AMP/C_R$ $(=(2/\sigma^2)\times(1/C_R))$ output from the respective multipliers 21, 51, 71 to be found between "±2 to ±2.5" in the post-normalization distribution obtained after normalizing the distribution of the probability information will be selected for the first additive coefficient $C_R$. Ideally, as for the decoder 3, a value of "$2/\sigma$" needs to be selected for the first additive coefficient $C_R$ in order to make the value of $AMP/C_R$ by which the received value $y_t$ is multiplied equal to "$1/\sigma^2$".

Table 2 below shows the ratio of the received value, or the clip range, where the average of the received value is found within "±2.5" in the post-normalization distribution obtained after normalizing the distribution of the received value. Note that the actual received value for each $E_b/N_o$ is also shown in Table 2.

TABLE 2

| code | $E_b/N_o$ (dB) | Range | Ratio (%) |
|---|---|---|---|
| PCCC (1/6) | −0.3 | ±4.48 | 97.4 |
| PCCC (1/3) | 0.0 | ±3.06 | 95.6 |
| PCCC (3/4) | 2.0 | ±1.62 | 85.9 |
| SCCC (1/3) | 0.5 | ±2.89 | 92.8 |

Ratio of the received value

As shown in the table above, the ratio of the received value found within the clip range is "about 97.4%" for PCCCs with a coding ratio of "1/6", "about 95.6%" for PCCCs with a coding ratio of "1/3", "about 85.9%" for PCCCs with a coding ratio of "3/4" and "about 92.8%" for SCCCs with a coding ratio of "1/3".

From these results, it will be seen that the performance shows little degradation when $E_b/N_o$ shows a large value if the ratio of the received value is found beyond the clip range.

Thus, as for the decoder 3, if the encoder 1 is adapted to do modulations, using a modulation method of arranging the signal points so as to provide a distribution of the received value for each bit, it is possible to optimally select a dynamic range and a quantization slot for the channel value $AMP \times y_{tj}$ input to the LSI by selecting a value that makes the average of the probability information input to the LSI is found within "±2 to ±2.5" in the post-normalization distribution obtained after normalizing the distribution of the probability information for the first additive coefficient $C_R$.

Note that, while the above simulation is described in terms of the BPSK modulation method, it has been proved that similar result can be obtained when the QPSK modulation method is used.

Now, a method for selecting a value for the first additive coefficient $C_R$ will be described for a situation where the encoder 1 is adapted to do modulations for TCM, using a modulation method of arranging the signal points that can not provide a distribution of the received value for each bit such as the 8PSK modulation method.

When the encoder 1 operates for TCM, the decoder 3 determines the Euclidean distance on the I/Q plane by computing the inner product of the input probability information by means of a circuit for computing and storing the log likelihood such as the Iγ computation/storage circuit 25 of the above described decoder 3' and uses the Euclidean distance as likelihood. However, the problem as described below arises if the quantization range at the upstream of the means for computing the inner product is smaller than the range of signal points.

Figure 27:
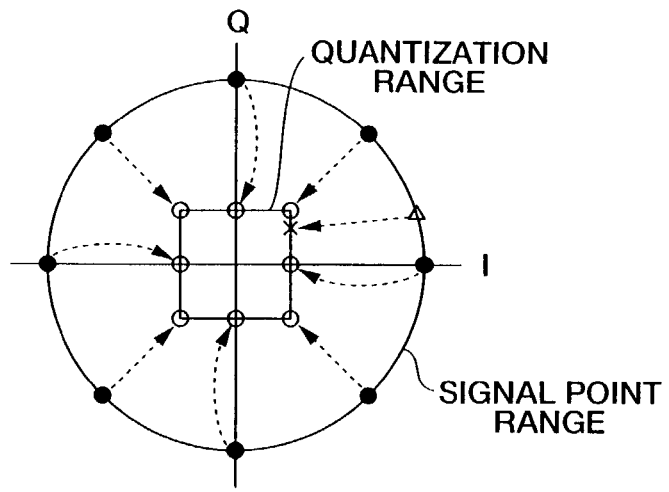
FIG. 27 is a graph illustrating an ordinary quantization range relative to signal points.

When the encoder do modulations by means of the 8PSK modulation method, the decoder clips the probability information obtained from the received value for both the I axis and the Q axis for quantization so that the probability information is two-dimensionally clipped as indicated by "○s" in FIG. 27. Thus, the range of quantization is normally smaller than that of signal points. Assume that the signal point indicated by "Δ" in FIG. 27 are quantized. The signal point is located closest to the signal point whose phase is "0°" on the I/Q plane. In such a case, the signal point is quantized in a manner as indicated by "x" so that it is erroneously regarded to be closest to the signal point whose phase is "45°" on the I/Q plane.

Figure 28:
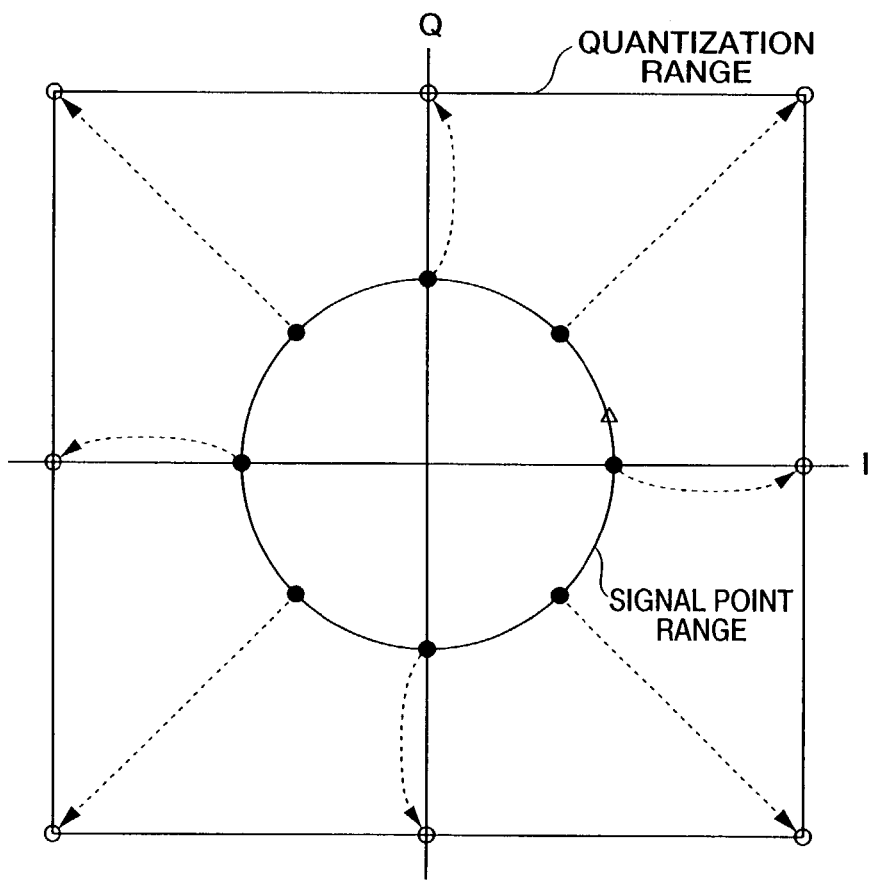
FIG. 28 is a graph illustrating a quantization range relative to a range of signal points, where the quantization range contains the range of signal points.
Figure 29:
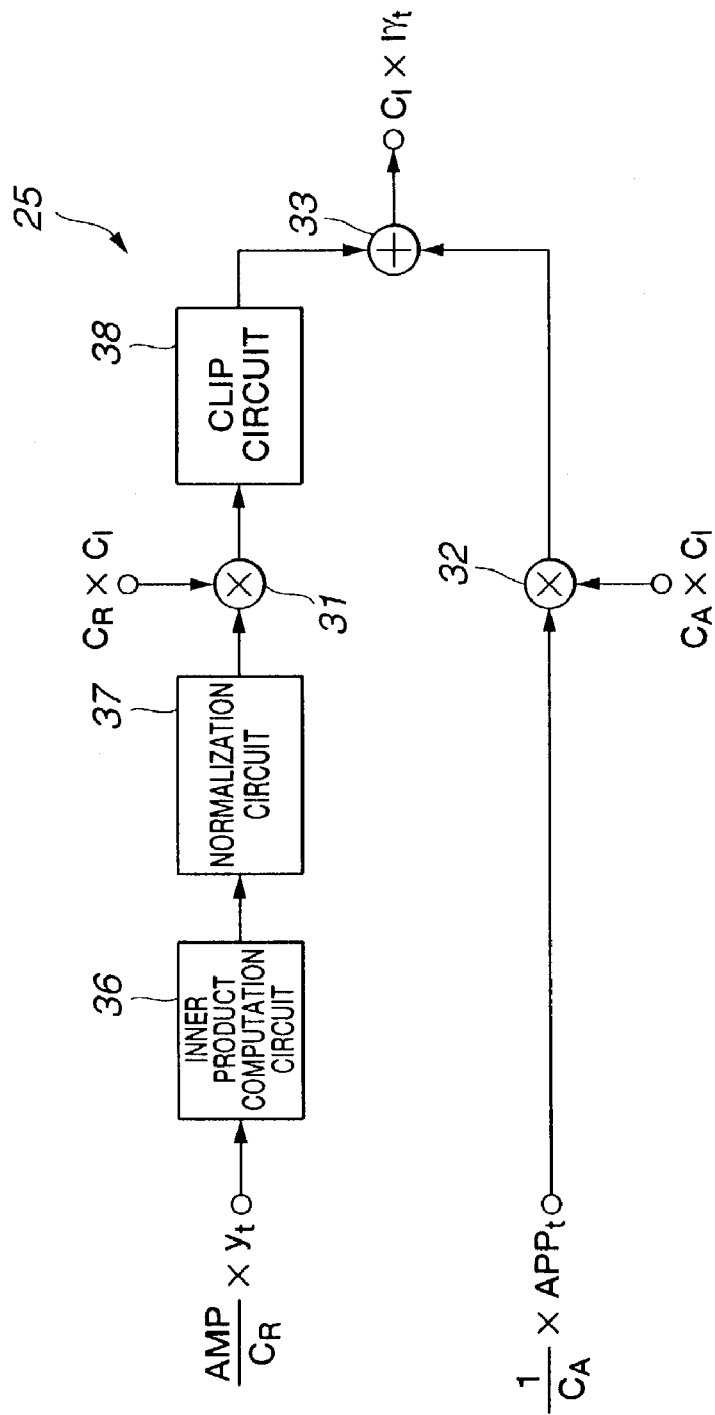
FIG. 29 is a schematic block diagram of the Iγ computation/storage circuit of the decoder of FIG. 16 when the encoder of FIG. 14 is adapted to TCM.

Therefore, the decoder 3 selects a value that provides a quantization range that contains the range of signal points for the first additive coefficient $C_R$ as shown in FIG. 28. Specifically, it is desirable to select a value that makes the quantization range about twice as large as the transmission amplitude of the encoder 1 for the first additive coefficient $C_R$. It has been proved by simulations that the best decoding accuracy is obtained when such a value is selected.

Then, the decoder 3 computes the inner product of the probability information $AMP/C_R \times y_{tj}$ that is input to the LSI by means of the circuit for computing and storing the log likelihood Iγ and subsequently computes the multiplication of the first additive coefficient $C_R$ and the third additive coefficient $C_I$, or $C_R \times C_I$. In the case of the above described decoder 3, for example, it computes the inner product of the probability information $AMP/C_R \times y_{tj}$ that is input to the soft-output decoding circuit 23 by means of the Iγ computation/storage circuit 25 and, after computing the inner product, computes the multiplication of the first additive coefficient $C_R$ and the third additive coefficient $C_I$, or $C_R \times C_I$, by means of the multiplier 31.

When the decoder 3 carries out an operation of normalization for correcting the biassed distribution of the computed inner products, it is desirable for the decoder 3 to compute the multiplication of the first additive coefficient $C_R$ and the third additive coefficient $C_I$, or $C_R \times C_I$, after the normalization in order to improve the performance.

Taking the above described factors into consideration, the circuit for computing and storing the log likelihood Iγ may be designed in a manner as described below.

In the case of the decoder 3, for example, the Iγ computation/storage circuit 25 is made to comprise two multipliers 31, 32 that are the first and second multiplication means and an adder 33 that is an addition means as well as an inner product computation circuit 36 for computing inner products, a normalization circuit 37 that is a normalization means for normalizing the inner product computed by the inner product computation circuit 36 and a clip circuit 38 that is a clip means for obtaining a predetermined dynamic range by clipping.

Thus, the Iγ computation/storage circuit 25 computes the inner product of the probability information $AMP/C_R \times y_{tj}$ that is supplied from the multiplier 21 by means of the inner product computation circuit 36 and supplies the obtained metric to the normalization circuit 37. Subsequently, the Iγ computation/storage circuit 25 corrects the biassed distribution of the metric by normalization that typically makes the smallest value of the metric equal to "0" by means of the normalization circuit 37 and then computes the multiplication of the the first additive coefficient $C_R$ and the third additive coefficient $C_I$, or $C_R \times C_I$, for the normalized metric by means of the multiplier 31. Them, it clips the obtained result by means of the clip circuit 38 and supplies the adder 33 with the outcome. At the same time, the Iγ computation/storage circuit 25 multiplies the probability information $AMP/C_R \times y_{tj}$ supplied from the multiplier 22 by the product of multiplication of the second additive coefficient $C_A$ and the third additive coefficient $C_I$, or $C_R \times C_I$, by means of the multiplier 32 and supplies the obtained product to the adder 33. Then, the Iγ computation/storage circuit 25 adds the outcomes of computation supplied from both the multiplier 32 and the clip circuit 38 by means of the adder 33 to obtain the log likelihood $C_I \times I\gamma_t$ and stores the obtained log likelihood $C_I \times I\gamma_t$ in a storage section (not shown).

Thus, when the decoder 3 needs to accommodate a situation where the encoder 1 is adapted to do modulations for TCM, using a modulation method of arranging the signal points that can not provide a distribution of the received value for each bit, it selects a value that makes the quantization range contain the range of signal points for the first additive coefficient $C_R$ and uses the obtained first additive coefficient $C_R$ for multiplication after computing the inner product in the inside of the LSI. With this arrangement, it is possible to optimally select both a dynamic range and a quantization range for the channel value $AMP \times y_{tj}$ input to the LSI and accurately carry out the decoding operation. Additionally, when the decoder 3 normalizes the computed inner products, the decoder 3 can carry out the decoding operation more accurately by performing the multiplication using the obtained first additive coefficient $C_R$ after the normalization.

Now, a method for optimally selecting values respectively for the second additive coefficient $C_A$ and the third additive coefficient $C_I$ will be discussed.

The decoder 3 selects such values respectively for the second additive coefficient $C_A$ and the third additive coefficient $C_I$ that makes the product of multiplication of the second additive coefficient $C_A$ and the third additive coefficient $C_I$, or $C_A \times C_I$, by which the probability information $1/C_A \times APP_t$ input to the LSI is multiplied, not less than "2". In other words, the decoder 3 selects such values respectively for the second additive coefficient $C_A$ and the third additive coefficient $C_I$ that allow the inner arithmetic operations of the LSI to be performed with a quantization slot smaller than the quantization slot to be used for expressing the generated external information $1/C_A \times EX_t$. In the case of the decoder 3', for example, values that make the product of multiplication of the second additive coefficient $C_A$ and the third additive coefficient $C_I$, or $C_A \times C_I$, not smaller than "2" will be selected respectively for the the second additive coefficient $C_A$ and the third additive coefficient $C_I$.

With this arrangement, the decoder 3 can reduce the number of bits necessary for expressing the external information $1/C_A \times EX_t$ and hence its circuit dimensions without degrading its performance. In other words, no degradation of performance occurs to the decoder 3 if the quantization slot to be used for expressing the external information $1/C_A \times EX_t$ is made rather large provided that the inner arithmetic operations of the LSI are performed with a fine quantization slot. This has also been proved by simulations.

In this way, it is possible to reduce the circuit dimensions and improve the accuracy of decoding operation of the decoder 3 by selecting values respectively for the second additive coefficient $C_A$ and the third additive coefficient $C_I$ that make the product of multiplication of the second additive coefficient $C_A$ and the third additive coefficient $C_I$, or $C_A \times C_I$, not smaller than "2".

It will be appreciated that the above described method of selecting values for the first, second and third additive coefficients is equally applicable to the above described decoders 3", 3'" and decodes adapted to do decoding operations by using the TTCM method or the SCTCM method.

While methods for optimally selecting values respectively for the first additive coefficient $C_R$, the second additive coefficient $C_A$ and the third additive coefficient $C_I$ are described above, the first additive coefficient $C_R$ can be used as convergence acceleration coefficient for iterative decoding.

When the first additive coefficient $C_R$ is used as convergence acceleration coefficient for iterative decoding, a value less than "1" is selected as the first additive coefficient $C_R$ for the decoding operations that comes after a predetermined number of times of decoding operations out of the total number of times M of iterative operations typically in initial stages of convergence.

This will be described more specifically below by referring to decoders 3" and 3'".

Assume that $C_{R11}, C_{R12}, \ldots, C_{RM1}, C_{RM2}$ are used for the first additive coefficient $C_R$ and input respectively to the processing circuits $53_{11}, 53_{12}, \ldots, 53_{M1}, 53_{M2}$ of the decoder 3". Then, the decoder 3" selects "$C_{R11} = C_{R12} = \ldots = C_{Ri2} \geq 1$" for the 2×i-th $C_{Ri2}$, i being an arbitrarily selected number, and also selects "$C_{Ri+11} = C_{Ri+12} = \ldots = C_{RM2} < 1$" as the first additive coefficients $C_{Ri+11}, C_{Ri+12}, \ldots, C_{RM2}$ that are to be input to the processing circuit $53_{i+11}$ that is immediately next to the processing circuit $53_{i2}$ through the last processing circuit $53M_2$ respectively.

On the other hand, in the decoder 3'", the processing circuits to which the first additive coefficient $C_R$ is input are limited to those that decodes the inner codes produced by the encoder 1'". Therefore, if $C_{R11}, C_{R21}, \ldots, C_{RM-11}, C_{RM1}$ are input respectively to processing circuits $73_{11}, 73_{21}, \ldots, 73_{M-11}, 73_{M1}$ of the decoder 3'", the decoder 3'" selects "$C_{R11} = C_{R21} = \ldots = C_{Ri1} \geq 1$" for the first additive coefficients $C_{R11}, C_{R21}, \ldots, C_{Ri1}$ that are to be input to the 2×i-1-th processing circuit $53_{i1}$, i being an arbitrarily selected number, and also selects "$C_{Ri+11} = C_{Ri+21} = \ldots = C_{RM1} < 1$" for the first additive coefficients $C_{Ri+11}, C_{Ri+21}, \ldots, C_{RM1}$ that are to be input from the processing circuit $53_{i+11}$ that is immediately next to the processing circuit $53_{i2}$ to the processing circuit $53_{M1}$.

Thus, for an iterative decoding operation, the decoder 3 selects a value less than "1" for the first additive coefficient $C_R$ that is input to each of the processing circuits, to whose soft-output decoding circuit the probability information AMP/$C_R \times y_{tj}$ is input and that are located downstream relative to a predetermined number of processing circuits out of the plurality of processing circuits, and performs the decoding operation by varying the first additive coefficient $C_R$ and thereby modifying the relationship between the first additive coefficient $C_R$ and the second additive coefficient $C_A$.

With this arrangement, it is possible to reduce the influence of the received value on the external information generated by each decoding operation in the case of an iterative decoding operation using the decoder 3. Then, the decoder 3 can accelerates the convergence and reduce the number of repeated operations.

In this way, it is possible for the decoder 3 to improve the processing speed by using the first additive coefficient $C_R$ not for optimally selecting a dynamic range and a quantization slot for the channel value AMP×$y_{tj}$ input to the LSI but as convergence acceleration coefficient for an iterative decoding operation.

Thus, when conducting an iterative decoding operation by means of the TTCM method, an appropriate value is selected for the first additive coefficient $C_R$ as in the case of the decoder 3". On the other hand, when conducting an iterative code decoding operation by means of the SCTCM method, an appropriate value is selected for the first additive coefficient $C_R$ as in the case of the decoder 3'''.

As described above in detail, in a data transmission/reception system comprising an encoder 1 and a decoder 3, the decoder 3 can optimally select a dynamic range and a quantization slot for the channel value AMP×$y_{tj}$ and the a priori probability information APP$_t$ to be input to an LSI that requires its inputs to be made with a fixed number of bits depending on the coefficient AMP by which the received value $y_{tj}$ is multiplied by selecting appropriate values for the first additive coefficient $C_R$, the second additive coefficient $C_A$ and the third additive coefficient $C_I$. Therefore, it is possible to optimally selects an quantization slot that is necessary for inner arithmetic operations of the LSI.

More specifically, if the encoder 1 is adapted to do modulations, using a modulation method of arranging the signal points that can provide a distribution of the received value for each bit, the decoder 3 selects a value that makes the average of the probability information input to the LSI is found within "±2 to ±2.5" in the post-normalization distribution obtained after normalizing the distribution of the probability information for the first additive coefficient $C_R$. If, on the other hand, if the encoder 1 is adapted to do modulations for TCM, using a modulation method of arranging the signal points that can not provide a distribution of the received value for each bit, the decoder 3 selects a value that makes the quantization range contain the range of signal points for the first additive coefficient $C_R$ and, if it normalizes the computed inner product, and uses the obtained first additive coefficient $C_R$ for multiplication after the normalization. With this arrangement for selecting an appropriate value for the first additive coefficient $C_R$, it is possible to optimally select a dynamic range and a quantization slot for the channel value AMP×$y_{tj}$ to be input to the LSI and realize a highly accurate decoding operation.

Additionally, the decoder 3 selects such values respectively for the second additive coefficient $C_A$ and the third additive coefficient $C_I$ that makes the product of multiplication of the second additive coefficient $C_A$ and the third additive coefficient $C_I$, or $C_A \times C_I$, not less than "2". With this arrangement, it is possible to reduce the circuit dimensions of the decoder 3 and realize a highly accurate decoding operation.

Furthermore, it is possible to use the first additive coefficient $C_R$ as convergence acceleration coefficient for an iterative decoding operation in order to raise the processing speed.

Thus, a data transmission/reception system comprising such an encoder 1 and a decoder 3 can perform decoding operations highly efficiently at high speed with reduced circuit dimensions to provide the user with an enhanced degree of reliability and convenience.

The present invention is by no means limited to the above described embodiment. For instance, the encoder may not be adapted to perform convolutional operations and may be adapted to encode with any coding ratio.

The above embodiment is so described above that each of the processing circuits $53_{11}$, $53_{12}$, . . . , $53_{M1}$, $53_{M2}$ for decoding PCCCs in the decoder 3" and the processing circuits $73_{11}$, $73_{12}$, . . . , $73_{M1}$, $73_{M2}$ for decoding SCCCs in the decoder 3''' comprise a soft-output decoding circuit and an interleaver or a deinterleaver along with one or more than one adders, however, and it can be applied to iterative decoding operations if at least the soft-output decoding circuit is realized as LSI.

Additionally, while decoder of the above described embodiment is adapted to do MAP decoding on the basis of the Log-BCJR algorithm, the present invention is also applicable to a decoder adapted to do MAP decoding on the basis of the Max-Log-BCJR algorithm.

Finally, while an encoder and a decoder are applied respectively to a transmitter and a receiver of a data transmission/reception system in the above description, the embodiment of the present invention can be applied to a recording and/or reproduction apparatus for recording signals onto and/or reproducing signals from a magnetic, optical or magneto-optical disc such as CD-ROM or MO (magneto-optical) disc. If such is the case, the data encoded by the encoder are stored in a recording medium that is equivalent to the above described memoryless communication channel and decoded and reproduced by the decoder.

The above described embodiment can be modified and/or altered without departing from the spirit and scope of the present invention.

The invention claimed is:

1. A decoder apparatus adapted to determine a log likelihood that expresses a probability of passing a state in the form of log ratio based on a received value as soft-input for decoding by using the log likelihood, said decoder apparatus comprising:

soft-output decoding means housed in the decoder apparatus for performing a decoding operation and for receiving, as input, first probability information and second probability information, the first probability information comprising a channel value divided by a first additive coefficient for regulating an amplitude of the received value, said channel value being produced by multiplying the received value by a predetermined coefficient, said first additive coefficient being adapted to be used for multiplying only the received value, and the second probability information comprising a priori probability information multiplied by a reciprocal of a second additive coefficient, said second additive coefficient being adapted to regulate an amplitude of the a priori probability information by multiplying only the a priori probability information, for soft-output decoding; and said soft-output decoding means generating a log soft-output describing a soft-output in a logarithmic form and extrinsic information by using the first additive coefficient for regulating the amplitude at the time of arithmetic operation of the soft-output decoding means, wherein the soft-output decoding means selects a desired dynamic range and quantization slot accuracy to exchange the extrinsic information via a connection means; and timing means housed in the decoder apparatus for defining a clock time, the clock time representing the duration of the decoding operation.

2. The decoder according to claim 1, wherein said soft-output decoding means further comprises:

first probability computation means for computing the log likelihood showing the first probability as determined for each received value from the code output pattern and said received value and expressing the log likelihood in a logarithmic form;

second probability computation means for computing the second log likelihood showing the second probability of transferring from the state of stating coding to each state on a time series basis as determined for each received value on the basis of said log likelihood and expressing the second log likelihood in a logarithmic form;

third probability computation means for computing the third log likelihood showing the third probability of transferring from an end state to each state on an inverse time series basis as determined for each received value on the basis of said first log likelihood and expressing the third log likelihood in a logarithmic form; and soft-output computation means for computing said log soft-output, using said first log likelihood, said second log likelihood and said third log likelihood.

3. The decoder according to claim 2, wherein said soft-output decoder means comprises an external information computation means for computing said external information, using said log soft-output supplied from said soft-output computation means and said a priori probability information.

4. The decoder according to claim 3, wherein said external information computation means regulates the amplitude of said external information using said log soft-output, said second probability information, said second additive coefficient and said third additive coefficient.

5. The decoder according to claim 4, wherein said external information computation means comprises:

third multiplication means for multiplying said product of multiplication of said log soft-output and said third additive coefficient by the reciprocal of the product of multiplication of said second additive coefficient and said third additive coefficient; and differentiation means for computing the difference between the information from said third multiplication means and said second probability information;

wherein said external information computation means is adapted to output the product of multiplication of said external information and the reciprocal of said second additive coefficient.

6. The decoder according to claim 2, wherein said first probability computation means regulates an amplitude of said log likelihood, using said first probability information, said second probability information, said first additive coefficient, said second additive coefficient and said third additive coefficient.

7. The decoder according to claim 6, wherein said first probability computation means comprises:

first multiplication means for multiplying said first probability information by the product of multiplication of said first additive coefficient and said third additive coefficient;

second multiplication means for multiplying said second probability information by the product of multiplication of said second additive coefficient and said third additive coefficient; and addition means for adding the information supplied from said first multiplication means and the information supplied from said second multiplication means;

wherein said first probability computation means is adapted to output a product of multiplication of said log likelihood and said third additive coefficient.

8. The decoder according to claim 6, wherein said second probability computation means is adapted to output a product of multiplication of said second log likelihood and said third additive coefficient on the basis of the amplitude-regulated log likelihood.

9. The decoder according to claim 6, wherein said third probability computation means is adapted to output a product of multiplication of said third log likelihood and said third additive coefficient on the basis of the amplitude-regulated log likelihood.

10. The decoder according to claim 6, wherein said soft-output computation means is adapted to output the product of multiplication of said log soft-output and said third additive coefficient.

11. The decoder according to claim 1, wherein each of said first additive coefficient, said second additive coefficient and said third additive coefficient is expressed by an exponential power of 2.

12. The decoder according to claim 1, wherein said third additive coefficient is a constant.

13. The decoder according to claim 1, wherein said third additive coefficient is a value not smaller than 1.

14. The decoder according to claim 1, wherein, when a corresponding encoder arranges the signal points to provide a distribution of the received value for each bit, said corresponding decoder is adapted to select a value for said first additive coefficient that makes the distribution of said first probability information show an average value between ±2 to ±2.5 for the normalized distribution obtained after normalization.

15. The decoder according to claim 14, wherein said first additive coefficient has a value expressed by $2/\sigma$, using the variance $\sigma^2$ of the distribution of said received value.

16. The decoder according to claim 1, wherein, when a corresponding encoder modulates such that the signal points can not provide a distribution of the received value for each bit, said corresponding decoder is adapted to select a value for said first additive coefficient that makes a quantization range contain the range of signal points.

17. The decoder according to claim 16,
wherein the value of said first additive coefficient is selected as to make said quantization range twice as large as a transmission amplitude of said corresponding encoder.

18. The decoder according to claim 16, wherein said soft-output decoding means comprises:
inner product computation means for computing an inner product of said first probability information; and
first multiplication means for multiplying a metric obtained as a result of computing the inner product by said inner product computation means by a product of multiplication of said first additive coefficient and said third additive coefficient.

19. The decoder according to claim 18, wherein said soft-output decoding means comprises:
normalization means for performing a normalizing operation of correcting a biased distribution of the inner product computed by said inner product computation means; and
said first multiplication means is adapted to multiply said metric obtained as a result of the normalizing operation of said normalization means by the product of multiplication of said first additive coefficient and said third additive coefficient.

20. The decoder according to claim 18,
wherein said soft-output decoding means has a clip means for clipping the information supplied from said first multiplication means to show a predetermined dynamic range.

21. The decoder according to claim 18, wherein said soft-output decoding means comprises:
second multiplication means for multiplying said second probability information by the product of said second additive coefficient and said third additive coefficient; and
addition means for adding the information supplied from said first multiplication means and the information supplied from said second multiplication means;
wherein said soft-output decoding means is adapted to output the product of multiplication of the first log likelihood expressing the first probability determined from the code output pattern and said received value in a logarithmic form and said third additive coefficient.

22. The decoder according to claim 1,
wherein said second additive coefficient and said third additive coefficient are selected to make the value of the product of multiplication of said second additive coefficient and said third additive coefficient equal or greater than 2.

23. The decoder according to claim 22,
wherein said soft-output decoding means performs inner arithmetic operations with a quantization slot finer than a quantization slot for expressing said external information.

24. The decoder according to claim 1,
wherein said decoder is integrally formed on a semiconductor substrate.

25. The decoder according to claim 1,
wherein the decoder is adapted to decode convolutional codes.

26. The decoder according to claim 1,
wherein the decoder is adapted to perform maximal a posteriori probability decoding on the basis of the Max-Log-BCJR algorithm or the Log-BCJR algorithm.

27. A decoding method for performing a decoding operation that determines a log likelihood that expresses a probability of passing a state in the form of log ratio on the basis of the received value as soft-input for decoding by using the log likelihood in a data transmission/reception system, said method comprising:
a soft-output decoding step of receiving, as input, first probability information and second probability information, the first probability information comprising a channel value divided by a first additive coefficient for regulating an amplitude of the received value,
said channel value being produced by multiplying the received value by a predetermined coefficient,
said first additive coefficient being adapted to be used for multiplying only the received value, and
the second probability information comprising a priori probability information multiplied by a reciprocal of a second additive coefficient,
said second additive coefficient being adapted to regulate an amplitude of the a priori probability information by multiplying only the a priori probability information;
defining a clock time, the clock time representing the duration of the decoding operation;
generating a log soft-output describing the soft-output at each clock time in a logarithmic form and extrinsic information by using the first additive coefficient, the second additive coefficient, and a third additive coefficient for regulating amplitude at the time of arithmetic operation of soft-output decoding; and
selecting a desired dynamic range and quantization slot accuracy to exchange the extrinsic information via a connection means.

28. A decoder apparatus for iteratively decoding a code generated by concatenating a plurality of element codes, said decoder adapted to determine a log likelihood expressing a probability of passing a state in the form of log ratio on the basis of a received value as soft-input for decoding by using the log likelihood, said decoder comprising:
a plurality of concatenated soft-output decoding means housed in the decoder apparatus for performing a decoding operation and for receiving as input first probability information and second probability information, the first probability information comprising a channel value divided by a first additive coefficient for regulating an amplitude of the received value,
said channel value being produced by multiplying the received value by a predetermined coefficient,
said first additive coefficient being adapted to be used for multiplying the received value, and
the second probability information comprising a priori probability information multiplied by a reciprocal of a second additive coefficient,
said second additive coefficient adapted to regulate an amplitude of the a priori probability information by multiplying only the a priori probability information;
wherein each of said soft-output decoding means generating a log soft-output describing the soft-output in a logarithmic form and extrinsic information by using the first additive coefficient, the second additive coefficient, and a third additive coefficient for regulating the amplitude at the time of arithmetic operation in the inside of the soft-output decoding means and outputting the generated extrinsic information as a priori probability information of an immediately succeeding soft-output decoding means, wherein the soft-output decoding means selects a desired dynamic range and quantization slot accuracy to exchange the extrinsic information via a connection means; and timing means housed in the decoder apparatus for defining a clock time, the clock time representing the duration of the decoding operation.

29. The decoder according to claim 28,
wherein the quantity of said soft-output decoding means is equal to the product of multiplication of a number of element codes and a number of repetitions of said iterative decoding operations.

30. The decoder according to claim 28,
wherein said soft-output decoding means comprises:
first probability computation means for computing the log likelihood showing the probability as determined for each received value from a code output pattern and said received value and expressing the log likelihood in a logarithmic form;
second probability computation means for computing a second log likelihood showing a second probability of transferring from the state of stating coding to each state on a time series basis as determined for each received value on the basis of said log likelihood and expressing the third log likelihood in a logarithmic form;
third probability computation means for computing a third log likelihood showing a third probability of transferring from an end state to each state on an inverse time series basis as determined for each received value on the basis of said log likelihood and expressing the third log likelihood in a logarithmic form; and
soft-output computation means for computing said log soft-output, using said log likelihood, said second log likelihood and said third log likelihood.

31. The decoder according to claim 30,
wherein said soft-output decoder means has an external information computation means for computing said extrinsic information, using said log soft-output supplied from said soft-output computation means and said a priori probability information.

32. The decoder according to claim 31,
wherein said external information computation means regulates the amplitude of said external information, using said log soft-output, said second probability information, said second additive coefficient and said third additive coefficient.

33. The decoder according to claim 32, wherein said external information computation means comprises:
third multiplication means for multiplying said product of multiplication of said log soft-output and said third additive coefficient by a reciprocal of the product of multiplication of said second additive coefficient and said third additive coefficient; and
differentiation means for computing a difference between information from said third multiplication means and said second probability information;
wherein said external information computation means is adapted to output a product of multiplication of said external information and the reciprocal of said second additive coefficient.

34. The decoder according to claim 30,
wherein said first probability computation means regulates the amplitude of said log likelihood using said first probability information, said second probability information, said first additive coefficient, said second additive coefficient and said third additive coefficient.

35. The decoder according to claim 34, wherein said first probability computation means comprises:
first multiplication means for multiplying said first probability information by the product of multiplication of said first additive coefficient and said third additive coefficient;
second multiplication means for multiplying said second probability information by the product of multiplication of said second additive coefficient and said third additive coefficient; and
addition means for adding the information supplied from said first multiplication means and the information supplied from said second multiplication means;
wherein said first probability computation means is adapted to output the product of multiplication of said log likelihood and said third additive coefficient.

36. The decoder according to claim 34,
wherein said second probability computation means is adapted to output the product of multiplication of said second log likelihood and said third additive coefficient on the basis of the amplitude-regulated log likelihood.

37. The decoder according to claim 34,
wherein said third probability computation means is adapted to output the product of multiplication of said third log likelihood and said third additive coefficient on the basis of the amplitude-regulated log likelihood.

38. The decoder according to claim 34,
wherein said soft-output computation means is adapted to output the product of multiplication of said log soft-output and said third additive coefficient.

39. The decoder according to claim 28,
wherein each of said first additive coefficient, said second additive coefficient and said third additive coefficient is expressed by an exponential power of 2.

40. The decoder according to claim 28,
wherein said third additive coefficient is a constant.

41. The decoder according to claim 28,
wherein said third additive coefficient is greater than or equal to 1.

42. The decoder according to claim 28,
wherein, when the corresponding encoder utilizes a modulation method of arranging signal points that provide a distribution of the received value for each bit, said decoder is adapted to select a value for said first additive coefficient such that the distribution of said first probability information show an average value between ±2 to ±2.5 for the normalized distribution obtained after the normalization.

43. The decoder according to claim 42,
wherein said first additive coefficient has a value expressed by 2/σ, using the variance $\sigma^2$ of the distribution of said received value.

44. The decoder according to claim 28,
wherein, a corresponding encoder utilizes a modulation method of arranging the signal points that can not provide a distribution of the received value for each bit, said decoder is adapted to select a value for said first additive coefficient that makes the quantization range contain the range of signal points.

45. The decoder according to claim 44,
wherein the value of said first additive coefficient is selected to make said quantization range twice as large as the transmission amplitude of said encoder.

46. The decoder according to claim 44, wherein said soft-output decoding means comprises:
inner product computation means for computing the inner product of said first probability information; and first multiplication means for multiplying a metric obtained as a result of computing the inner product by said inner product computation means by the product of multiplication of said first additive coefficient and said third additive coefficient.

47. The decoder according to claim 46, wherein said soft-output decoding means comprises:
normalization means for performing a normalizing operation of correcting the biased distribution of the inner product computed by said inner product computation means;
wherein said first multiplication means is adapted to multiply said metric obtained as a result of the normalizing operation of said normalization means by the product of multiplication of said first additive coefficient and said third additive coefficient.

48. The decoder according to claim 46,
wherein said soft-output decoding means has a clip means for clipping the information supplied from said first multiplication means to show a predetermined dynamic range.

49. The decoder according to claim 46, wherein said soft-output decoding means comprises:
second multiplication means for multiplying said second probability information by the product of said second additive coefficient and said third additive coefficient; and
addition means for adding the information supplied from said first multiplication means and the information supplied from said second multiplication means;
wherein said soft-output decoding means is adapted to output the product of multiplication of the log likelihood expressing the first probability determined from the code output pattern and said received value in a logarithmic form and said third additive coefficient.

50. The decoder according to claim 28,
wherein said second additive coefficient and said third additive coefficient are selected such that the value of the product of multiplication of said second additive coefficient and said third additive coefficient greater than or equal to 2.

51. The decoder according to claim 50,
wherein said soft-output decoding means performs inner arithmetic operations with a quantization slot finer than a quantization slot for expressing said external information.

52. The decoder according to claim 28,
wherein a value smaller than 1 is selected for said first additive coefficient to be input to the soft-output decoding means adapted to receive said first probability information as input and arranged downstream relative to a predetermined number of soft-output decoding means out of said plurality of soft-output decoding means.

53. The decoder according to claim 28, further comprising:
interleave means for interleaving or deinterleaving the external information generated by said soft-output decoding means; and
delay means for delaying said first probability information by a time period equal to the processing time period necessary for said soft-output decoding means and said interleave means.

54. The decoder according to claim 28,
wherein said soft-output decoding means is integrally formed on a semiconductor substrate.

55. The decoder according to claim 28,
wherein the decoder is adapted to iteratively decode codes obtained by parallel concatenated coding, serially concatenated coding, parallel concatenated coding modulation or serially concatenated coding modulation.

56. The decoder according to claim 55,
wherein the decoder is adapted to decode convolutional codes.

57. The decoder according to claim 55,
wherein the decoder is adapted to perform maximal a posteriori probability decoding on the basis of the Max-Log-BCJR algorithm or the Log-BCJR algorithm.

58. A decoding method for performing a decoding operation that iteratively decodes a code generated by concatenating a plurality of element codes in a data transmission/reception system, said method being adapted to determine a log likelihood that expresses a probability of passing a state in the form of log ratio based on a received value as soft-input for decoding by using the log likelihood, said method comprising:
a plurality of consecutive soft-output decoding steps of receiving as input first probability information and second probability information, the first probability information comprising a channel value divided by a first additive coefficient for regulating the amplitude of the received value;
said channel value being produced by multiplying the received value by a predetermined coefficient,
said first additive coefficient being adapted to be used for multiplying only the received value, and
the second probability information comprising a priori probability information multiplied by a reciprocal of a second additive coefficient,
said second additive coefficient being adapted to regulate an amplitude of the a priori probability information by multiplying the a priori probability information;
generating a log soft-output describing the soft-output in a logarithmic form and extrinsic information by using the first additive coefficient, the second additive coefficient, and a third additive coefficient for regulating an amplitude at the time of arithmetic operation in the inside and outputting the generated extrinsic information as a priori probability information of the immediately succeeding soft-output decoding step for the purpose of soft-output decoding;
selecting a desired dynamic range and quantization slot accuracy to exchange the extrinsic information via a connection means; and
defining a clock time, the clock time representing the duration of the decoding operation.

* * * * *